US009294745B2

(12) United States Patent
Olsen et al.

(10) Patent No.: US 9,294,745 B2
(45) Date of Patent: Mar. 22, 2016

(54) DIGITAL CAMERAS WITH DIRECT LUMINANCE AND CHROMINANCE DETECTION

(71) Applicant: PROTARIUS FILO AG, L.L.C., Dover, DE (US)

(72) Inventors: Richard Ian Olsen, Truckee, CA (US); James Gates, Carlsbad, CA (US); Darryl L. Sato, Irvine, CA (US)

(73) Assignee: Callahan Cellular L.L.C., Wilmington, DE (US)

( * ) Notice: Subject to any disclaimer, the term of this patent is extended or adjusted under 35 U.S.C. 154(b) by 241 days.

(21) Appl. No.: 14/149,024

(22) Filed: Jan. 7, 2014

(65) Prior Publication Data

US 2014/0125837 A1 May 8, 2014

Related U.S. Application Data

(63) Continuation of application No. 13/647,708, filed on Oct. 9, 2012, now Pat. No. 8,629,390, which is a continuation of application No. 13/100,725, filed on May 4, 2011, now Pat. No. 8,304,709, which is a (Continued)

(51) Int. Cl.
*H04N 9/097* (2006.01)
*G02B 9/12* (2006.01)
(Continued)

(52) U.S. Cl.
CPC .............. *H04N 9/097* (2013.01); *G02B 3/0062* (2013.01); *G02B 3/0075* (2013.01); *G02B 9/12* (2013.01); *H01L 27/14618* (2013.01); *H01L 27/14621* (2013.01); *H01L 27/14625* (2013.01); *H01L 27/14645* (2013.01); *H01L 31/0232* (2013.01);

(Continued)

(58) Field of Classification Search
CPC . H04N 9/097; G02B 3/0031; H01L 27/14618
USPC .............. 250/208.1, 559.08, 226; 348/223.1, 348/280, 297, 308, 262
See application file for complete search history.

(56) References Cited

U.S. PATENT DOCUMENTS 3,609,367 A 9/1971 Barron
3,971,065 A 7/1976 Bayer
(Continued)

FOREIGN PATENT DOCUMENTS

EP 0 599 470 6/1994
EP 1 032 045 8/2000
JP 62-011264 1/1987

OTHER PUBLICATIONS

Communication from the European Patent Office on European Patent Application 05793927.4, mailed Feb. 10, 2012.
(Continued)

*Primary Examiner* — Seung C Sohn

(57) ABSTRACT

Digital camera systems and methods are described that provide a color digital camera with direct luminance detection. The luminance signals are obtained directly from a broadband image sensor channel without interpolation of RGB data. The chrominance signals are obtained from one or more additional image sensor channels comprising red and/or blue color band detection capability. The red and blue signals are directly combined with the luminance image sensor channel signals. The digital camera generates and outputs an image in YCrCb color space by directly combining outputs of the broadband, red and blue sensors.

20 Claims, 23 Drawing Sheets

Related U.S. Application Data continuation of application No. 11/810,623, filed on Jun. 6, 2007, now Pat. No. 7,964,835, and a continuation-in-part of application No. 11/212,803, filed on Aug. 25, 2005, now abandoned.

(60) Provisional application No. 60/811,584, filed on Jun. 6, 2006.

(51) Int. Cl.

| | |
|---|---|
| *H01L 27/146* | (2006.01) |
| *H01L 31/0232* | (2014.01) |
| *H04N 5/225* | (2006.01) |
| *H04N 5/235* | (2006.01) |
| *H04N 5/33* | (2006.01) |
| *H04N 5/335* | (2011.01) |
| *H04N 5/353* | (2011.01) |
| *H04N 9/04* | (2006.01) |
| *H04N 9/09* | (2006.01) |
| *G02B 3/00* | (2006.01) |

(52) U.S. Cl.
 CPC ............ *H04N 5/2253* (2013.01); *H04N 5/2254* (2013.01); *H04N 5/2351* (2013.01); *H04N 5/2353* (2013.01); *H04N 5/332* (2013.01); *H04N 5/335* (2013.01); *H04N 5/353* (2013.01); *H04N 5/3532* (2013.01); *H04N 9/045* (2013.01); *H04N 9/09* (2013.01); *G02B 3/0031* (2013.01); *G02B 3/0043* (2013.01); *H01L 2924/0002* (2013.01); *H04N 2209/049* (2013.01)

(56) References Cited

U.S. PATENT DOCUMENTS

| | | | |
|---|---|---|---|
| 4,323,925 A | 4/1982 | Abell et al. | |
| 4,385,373 A | 5/1983 | Howe | |
| 4,688,080 A | 8/1987 | Wagner | |
| 4,894,672 A | 1/1990 | Tanaka | |
| 5,005,083 A | 4/1991 | Grage et al. | |
| 5,051,830 A | 9/1991 | Von Hoessle | |
| 5,436,660 A | 7/1995 | Sakamoto | |
| 5,604,534 A | 2/1997 | Hedges et al. | |
| 5,654,752 A | 8/1997 | Yamazaki | |
| 5,691,765 A | 11/1997 | Schieltz et al. | |
| 5,694,165 A | 12/1997 | Yamazaki et al. | |
| 5,742,659 A | 4/1998 | Atac et al. | |
| 5,760,832 A | 6/1998 | Yamanaka et al. | |
| 5,766,980 A | 6/1998 | Ohtagaki et al. | |
| 5,850,479 A | 12/1998 | Terry et al. | |
| 6,100,937 A * | 8/2000 | DiMeo ..................... G06T 5/50 348/560 | |
| 6,137,535 A | 10/2000 | Meyers | |
| 6,195,126 B1 * | 2/2001 | Kikuchi ............... H04N 1/2112 348/231.3 | |
| 6,375,075 B1 | 4/2002 | Ackley et al. | |
| 6,381,072 B1 | 4/2002 | Burger | |
| 6,429,898 B1 | 8/2002 | Shoda et al. | |
| 6,437,335 B1 | 8/2002 | Bohn | |
| 6,570,613 B1 | 5/2003 | Howell | |
| 6,611,289 B1 | 8/2003 | Yu et al. | |
| 6,617,565 B2 | 9/2003 | Wu | |
| 6,714,239 B2 | 3/2004 | Guidash | |
| 6,727,521 B2 | 4/2004 | Merrill | |
| 6,765,617 B1 | 7/2004 | Tangen et al. | |
| 6,833,873 B1 | 12/2004 | Suda | |
| 6,834,161 B1 | 12/2004 | Stiehler | |
| 6,841,816 B2 | 1/2005 | Merrill et al. | |
| 6,859,299 B1 | 2/2005 | Chiao | |
| 6,882,368 B1 | 4/2005 | Suda | |
| 6,885,398 B1 | 4/2005 | Sladen | |
| 6,885,404 B1 | 4/2005 | Suda | |
| 6,885,508 B2 | 4/2005 | Yamaguchi et al. | |
| 6,903,770 B1 | 6/2005 | Kobayashi et al. | |
| 6,946,647 B1 | 9/2005 | O'Neill et al. | |
| 6,952,228 B2 | 10/2005 | Yoneda et al. | |
| 6,999,130 B2 | 2/2006 | Tanigawa | |
| 7,095,159 B2 | 8/2006 | Machida | |
| 7,115,853 B2 | 10/2006 | Jiang et al. | |
| 7,123,298 B2 | 10/2006 | Schroeder et al. | |
| 7,170,665 B2 | 1/2007 | Kaneko et al. | |
| 7,199,348 B2 | 4/2007 | Olsen et al. | |
| 7,206,136 B2 | 4/2007 | Labaziewicz et al. | |
| 7,214,926 B2 | 5/2007 | Gruhlke et al. | |
| 7,223,954 B2 | 5/2007 | McNulty | |
| 7,236,306 B2 | 6/2007 | Janson, Jr. et al. | |
| 7,239,345 B1 | 7/2007 | Rogina | |
| 7,256,944 B2 | 8/2007 | Labaziewicz et al. | |
| 7,280,290 B2 | 10/2007 | Araki et al. | |
| 7,305,180 B2 | 12/2007 | Labaziewicz et al. | |
| 7,358,483 B2 | 4/2008 | Mitsugi et al. | |
| 7,362,357 B2 | 4/2008 | Brown et al. | |
| 7,379,104 B2 | 5/2008 | Hattori et al. | |
| 7,417,674 B2 | 8/2008 | Gruhlke et al. | |
| 7,436,038 B2 | 10/2008 | Engelmann et al. | |
| 7,460,160 B2 | 12/2008 | Hershey et al. | |
| 7,570,809 B1 | 8/2009 | Srinivasa | |
| 7,864,211 B2 | 1/2011 | Mowry | |
| 2002/0020845 A1 | 2/2002 | Ogura et al. | |
| 2002/0024606 A1 | 2/2002 | Yuki et al. | |
| 2002/0051071 A1 | 5/2002 | Itano et al. | |
| 2002/0067416 A1 | 6/2002 | Yoneda et al. | |
| 2002/0075481 A1 | 6/2002 | Roustaei | |
| 2002/0089596 A1 | 7/2002 | Suda | |
| 2002/0113888 A1 | 8/2002 | Sonoda et al. | |
| 2002/0122124 A1 | 9/2002 | Suda | |
| 2002/0142798 A1 | 10/2002 | Miyake | |
| 2003/0020814 A1 | 1/2003 | Ono | |
| 2003/0086013 A1 | 5/2003 | Aratani | |
| 2003/0095711 A1 | 5/2003 | McGuinness et al. | |
| 2003/0151685 A1 | 8/2003 | La Grone | |
| 2003/0160886 A1 | 8/2003 | Misawa et al. | |
| 2003/0209651 A1 | 11/2003 | Iwasaki | |
| 2003/0234907 A1 | 12/2003 | Kawai | |
| 2004/0012688 A1 | 1/2004 | Tinnerino et al. | |
| 2004/0012689 A1 | 1/2004 | Tinnerino et al. | |
| 2004/0017620 A1 | 1/2004 | Kaneko et al. | |
| 2004/0027687 A1 | 2/2004 | Bittner et al. | |
| 2004/0080638 A1 | 4/2004 | Lee | |
| 2004/0095495 A1 | 5/2004 | Inokuma et al. | |
| 2004/0183918 A1 | 9/2004 | Squilla et al. | |
| 2005/0024731 A1 | 2/2005 | Mitchell et al. | |
| 2005/0128335 A1 | 6/2005 | Kolehmainen et al. | |
| 2005/0128509 A1 | 6/2005 | Tokkonen et al. | |
| 2005/0134712 A1 | 6/2005 | Gruhlke et al. | |
| 2005/0160112 A1 | 7/2005 | Makela et al. | |
| 2005/0248667 A1 | 11/2005 | Schweng et al. | |
| 2005/0285955 A1 | 12/2005 | Utz et al. | |
| 2006/0087572 A1 | 4/2006 | Schroeder | |
| 2006/0108505 A1 | 5/2006 | Gruhlke et al. | |
| 2006/0125936 A1 | 6/2006 | Gruhike et al. | |
| 2006/0187322 A1 | 8/2006 | Janson, Jr. et al. | |
| 2006/0187338 A1 | 8/2006 | May et al. | |
| 2006/0222220 A1 | 10/2006 | Yamano et al. | |
| 2007/0002159 A1 | 1/2007 | Olsen et al. | |

OTHER PUBLICATIONS

Duparre et al., "Artificial apposition compound eye fabricated by micro-optics technology," Applied Optics, vol. 43, No. 22, Aug. 2004, pp. 4303-4310.

Duparre et al., "Artificial compound eyes—different concepts and their application to ultra flat image acquisition sensors," Proceedings of SPIE, vol. 5346 (SPIE, Bellingham, WA, 2004), pp. 89-100.

Duparre et al., "Microoptical telescope compound eyes," Optics Express, vol. 13, No. 3, Feb. 2005, pp. 889-903.

Duparre et al., "Theoretical analysis of an artificial superposition compound eye for application in ultra flat digital image acquisition devices," Proceedings of SPIE, vol. 5249, 2004, pp. 408-418.

(56) References Cited

OTHER PUBLICATIONS

Duparre et al., "Ultra-Thin Camera Based on Artificial Apposition Compound Eyes," Proc. 10th Microoptics Conference MOC '04, Jena, 2004, Paper E-2 (2 pages).
Final Office Action on U.S. Appl. No. 11/212,803, mailed Sep. 20, 2007.
First Office Action for Chinese Application 200580032374.0, notification date Feb. 5, 2010.
International Preliminary Report on Patentability for PCT/US2005/030256 issued Mar. 17, 2009.
International Preliminary Report on Patentability for PCT/US2006/025781 issued Mar. 10, 2009.
International Search Report and Written Opinion for PCT/US05/30256 mailed Jul. 7, 2008.
International Search Report and Written Opinion for PCT/US06/25781 mailed Jul. 22, 2008.
Kitamura et al., "Reconstruction of a high-resolution image on a compound-eye image-capturing system," Applied Optics, vol. 43, No. 8, Mar. 2004, pp. 1719-1727.
Miki et al., "A Study of Multi-Stack Silicon-Direct Wafer Donding for MEMS Manufacturing," 2002, IEEE, pp. 407-410.
Miyatake et al., "Thin observation module by bound optics (TOMBO0 with color filters," SPEI and IS&T, vol. 5301, 2004, pp. 7-12.
Non-final Office Action on U.S. Appl. No. 11/212,803, mailed Feb. 7, 2007.
Non-Final Office Action on U.S. Appl. No. 11/265,669, mailed Feb. 28, 2006.
Non-Final Office Action on U.S. Appl. No. 11/322,959, mailed Aug. 8, 2007.
Non-Final Office Action on U.S. Appl. No. 11/788,122, mailed Jun. 27, 2008.
Non-Final Office Action on U.S. Appl. No. 11/888,546, mailed May 1, 2008.
Non-Final Office Action on U.S. Appl. No. 11/888,570, mailed May 28, 2008.
Norvell, Robin, "Shellcase Debuts Ultra-Thin Miniaturization for Optics," Jul. 8, 2005, 1 page.
Notice of Allowance for U.S. Appl. No. 11/478,242, mailed Dec. 30, 2009.
Notice of Allowance for U.S. Appl. No. 11/888,546, mailed Dec. 14, 2009.
Notice of Allowance of U.S. Appl. No. 11/825,382, mailed May 5, 2010.
Notice of Allowance on U.S. Appl. No. 11/729,132, mailed Oct. 11, 2011.
Notice of Allowance on U.S. Appl. No. 11/265,669, mailed Oct. 27, 2006.
Notice of Allowance on U.S. Appl. No. 11/788,122, mailed Mar. 9, 2009.
Notice of Allowance on U.S. Appl. No. 11/788,279, mailed Oct. 28, 2010.
Notice of Allowance on U.S. Appl. No. 11/810,623, mailed Feb. 2, 2011.
Notice of Allowance on U.S. Appl. No. 11/888,546, mailed Dec. 2, 2008.
Notice of Allowance on U.S. Appl. No. 11/888,546, mailed Jun. 3, 2009.
Notice of Allowance on U.S. Appl. No. 11/888,570, mailed Mar. 23, 2009.
Notice of Allowance on U.S. Appl. No. 11/888,582, mailed Aug. 6, 2010.
Notice of Allowance on U.S. Appl. No. 12/496,854, mailed Feb. 16, 2012.
Notice of Allowance on U.S. Appl. No. 13/006,351, mailed May 17, 2011.
Notice of Allowance on U.S. Appl. No. 13/006,351, mailed Dec. 21, 2012.
Notice of Allowance on U.S. Appl. No. 13/100,725, mailed Jul. 23, 2012.
Notice of Allowance on U.S. Appl. No. 13/345,007, mailed Jan. 14, 2013.
Notice of Allowance on U.S. Appl. No. 13/465,229, mailed Aug. 20, 2012.
Notice of Allowance on U.S. Appl. No. 13/647,708, mailed Sep. 13, 2013.
Notice of Allowance on U.S. Appl. No. 13/681,603, mailed Jul. 22, 2013.
Notice of Allowance on U.S. Appl. No. 13/786,803, mailed Oct. 10, 2013.
Office Action for U.S. Appl. No. 11/825,382, mailed Oct. 29, 2009.
Office Action on U.S. Appl. No. 11/788,279, mailed Jan. 21, 2010.
Office Action on U.S. Appl. No. 11/810,623, mailed Aug. 18, 2010.
Office Action on U.S. Appl. No. 11/478,242, mailed Sep. 16, 2009.
Office Action on U.S. Appl. No. 11/729,132, mailed Feb. 3, 2011.
Office Action on U.S. Appl. No. 11/788,120, mailed Apr. 16, 2010.
Office Action on U.S. Appl. No. 11/788,120, mailed May 19, 2009.
Office Action on U.S. Appl. No. 11/788,120, mailed Jul. 30, 2010.
Office Action on U.S. Appl. No. 11/788,120, mailed Sep. 18, 2009.
Office Action on U.S. Appl. No. 11/788,279, mailed Aug. 4, 2010.
Office Action on U.S. Appl. No. 11/810,623 mailed Feb. 4, 2010.
Search Report for EP Application 05793927.4, dated Feb. 26, 2010.
Second Office Action on Chinese Application 200580032374.0, issued Sep. 9, 2010.
Shogenji et al., "Bimodal fingerprint capturing system based on compound-eye imaging module," Applied Optics, vol. 43, No. 6, Feb. 2004, pp. 1355-1359.
Shogenji et al., "Multispectral imaging using compact compound optics," Optics Express, vol. 12, No. 8, Apr. 2004, pp. 1643-1655.
Stager et al., "Replicated Micro-Optics for Automotive Applications," SPIE European Workshop on Photonics in the Automobile, Geneva, 2004, (8 pages).
Tanida et al., "Compact image capturing system based on compound imaging and idgital reconstruction," Proceedings of SPIE, vol. 4455, 2001, pp. 34-41.
Tanida, "Color imaging with an integrated compound imaging system," Optics Express, vol. 11, No. 18, Sep. 2003, pp. 2109-2117.
Third Office Action issued on Chinese Application 200580032374.0, mailed May 24, 2011 (with English translation).
Volkel et al., "Miniaturization of Imaging Systems," mstnews, Feb. 2003, pp. 36-38.
Volkel et al., "Miniaturized imaging systems," Elsevier Science B.V., Microelectronic Engineering 67-68 (2003), pp. 461-472.
Wood et al., "Resolution Improvement for Compound Eye Images Through Lens Diversity," IEEE, Signal Processing Society, DSP/SPE Workshop, Aug. 2, 2004 (5 pages).
Communication on EP Application 05793927.4, mailed Jul. 8, 2015.
Notice of Allowance on U.S. Appl. No. 14/063,236, mailed Sep. 2, 2015.
Notice of Allowance on U.S. Appl. No. 14/171,963, mailed Dec. 2, 2015.

* cited by examiner

Directly detect luminance data using broadband wavelength response without the use of RGB color data.
292

↓

Generate chrominance data by detecting red and blue color band data and directly combining chrominance data of each band with luminance data.
294

↓

Output image in YCrCb color spacing using the luminance and chrominance data.
296

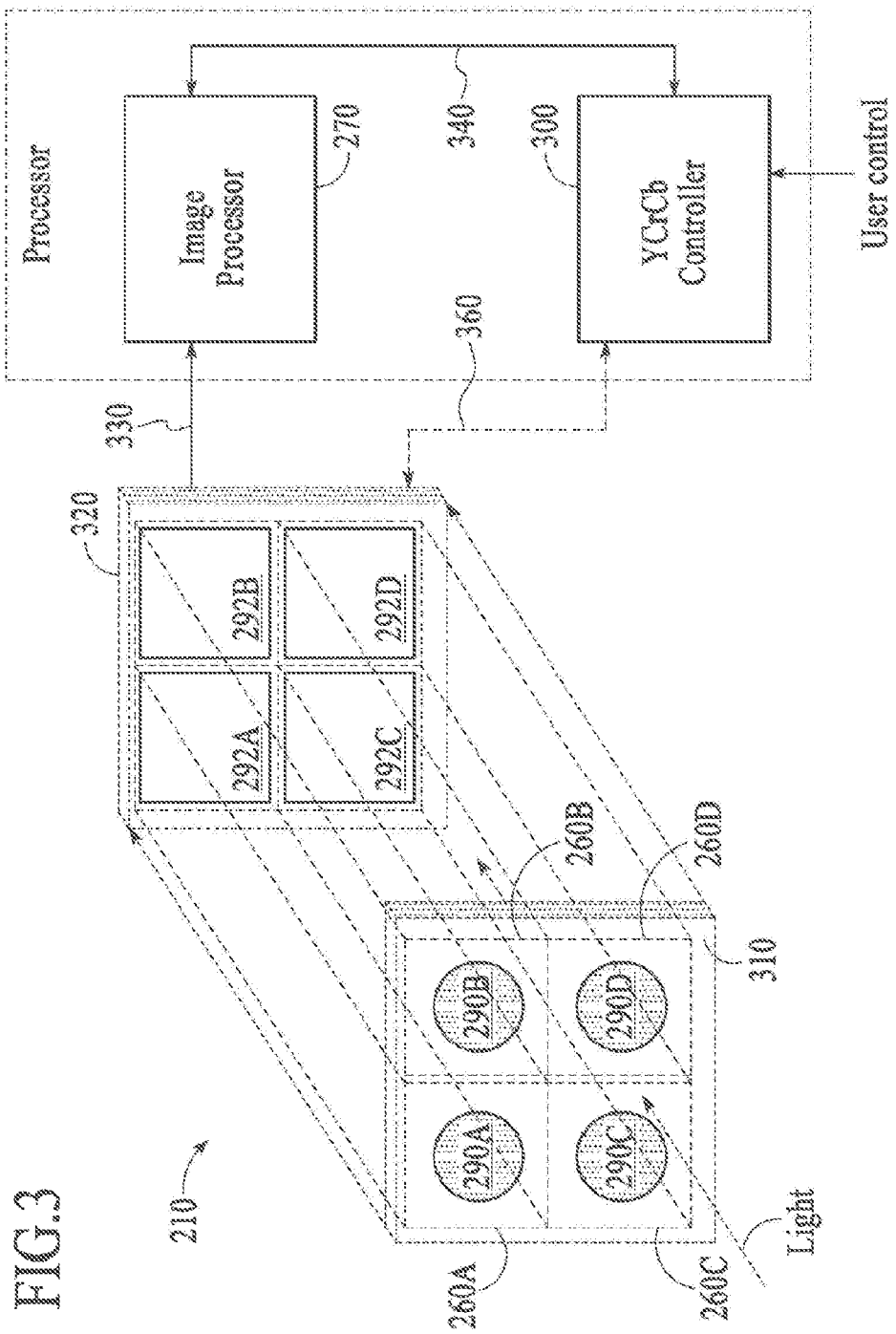

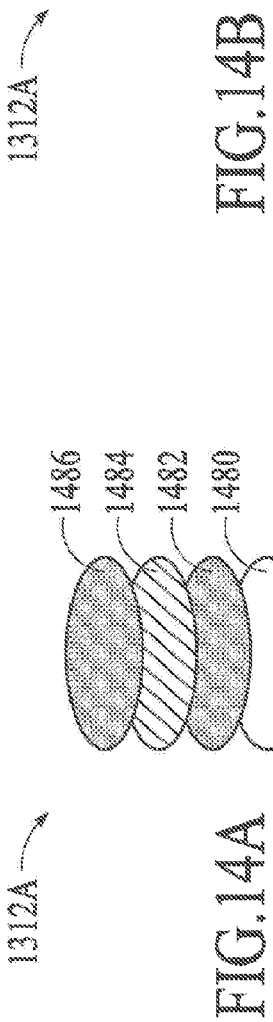
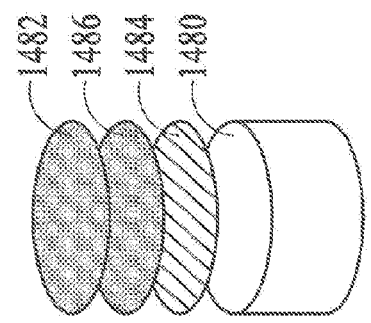
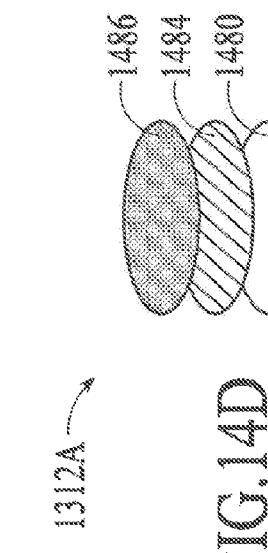
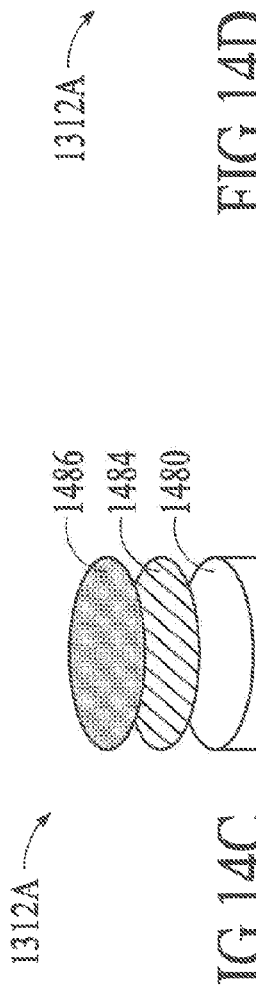
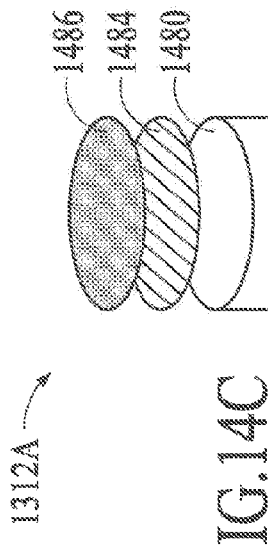

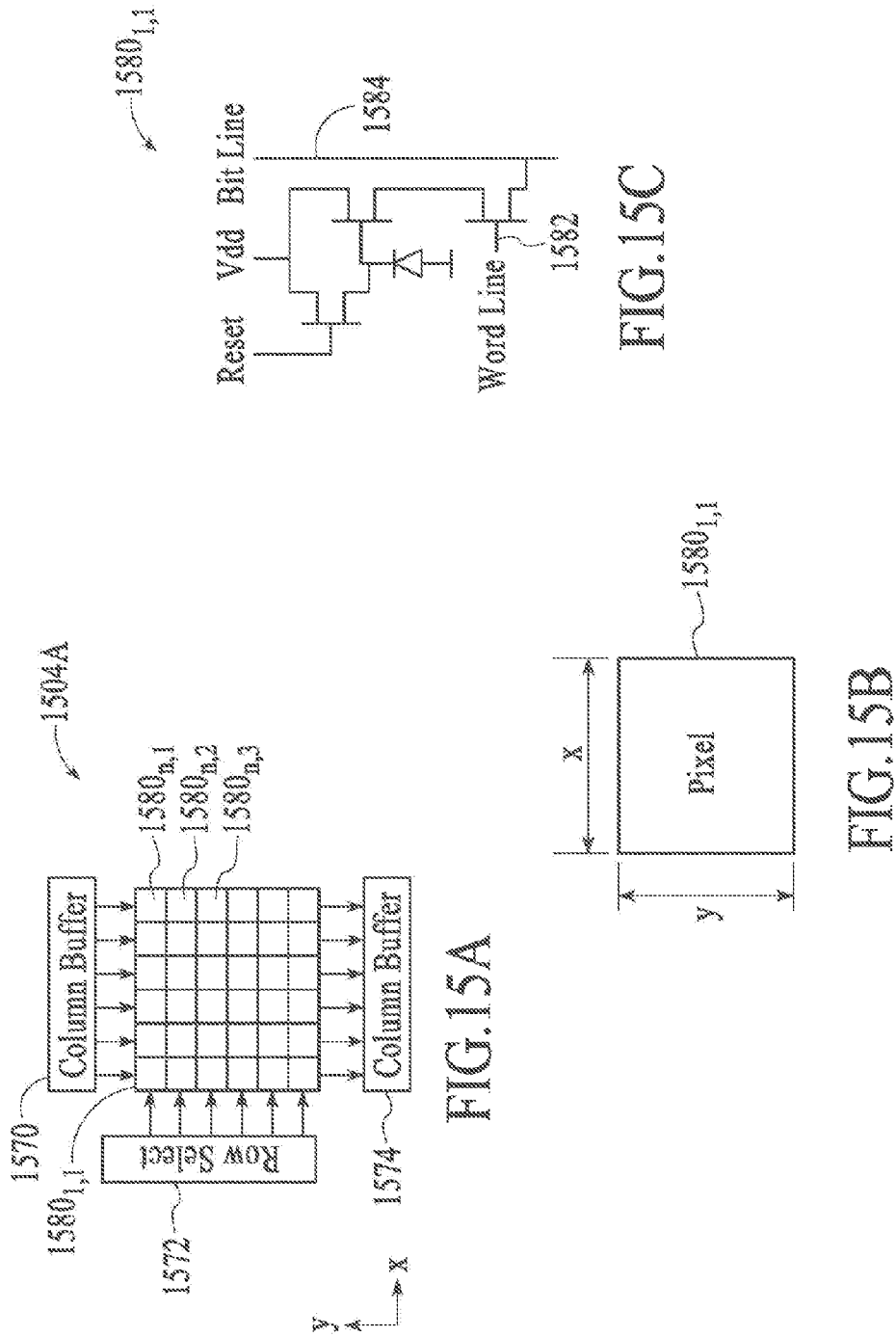

ized, as the difference between these terms is a minor difference having to do with use of gamma corrected or linear pixel signals used in the calculations.

DIGITAL CAMERAS WITH DIRECT LUMINANCE AND CHROMINANCE DETECTION

CROSS-REFERENCE TO RELATED PATENT APPLICATIONS

This application is a continuation of U.S. application Ser. No. 13/647,708, filed Oct. 9, 2012, which is a Continuation of U.S. patent application Ser. No. 13/100,725, filed May 4, 2011, (now U.S. Pat. No. 8,304,709) which is a Continuation of U.S. patent application Ser. No. 11/810,623, filed on Jun. 6, 2007, (now U.S. Pat. No. 7,964,835) which is a Continuation-In-Part of U.S. patent application Ser. No. 11/212,803, filed Aug. 25, 2005, all of which are incorporated herein by reference in their entirety. U.S. application Ser. No. 11/810,623, claims priority from U.S. Provisional Application 60/811,584, filed Jun. 6, 2006, incorporated herein by reference in its entirety.

TECHNICAL FIELD

The following disclosure relates generally to optical devices and more particularly to digital cameras and other systems with direct luminance and chrominance detection.

BACKGROUND

Color is the perceptual result of light in the visible region of the spectrum (wavelengths approximately in the region of 400 nanometer (nm) to 700 nm) incident upon the retina of the human eye. The human retina has three types of color photoreceptors or cone cells, which respond to incident radiation with somewhat different spectral response curves. Because there are exactly three types of color photoreceptors, three numerical components are necessary and sufficient to describe a color, providing that appropriate spectral weighting functions are used. One description of color uses the representation "RGB", or "RGB color space", and refers to colors red (R), blue (B) and green (G). The red, blue and green colors include the color bands that conventional solid-state electronic cameras capture; these colors also approximately represent colors as viewed by humans. It is a challenge for the designers of digital imagers to achieve solutions that provide images almost equivalent to human vision.

Another description of color includes "YUV," a color encoding system used for analog television worldwide (NTSC, PAL and SECAM). When color television (TV) signals were developed in the 1950s, YUV was used to encode colors in order to allow black and white TVs to continue to receive and decode monochrome signals from TV signals, while color sets would decode both monochrome and color signals. The Y in YUV represents "luma" which is brightness, or lightness, and black and white TVs decode only the Y part of the signal. The U and V in YUV represent color (chroma) information and are "color difference" signals of blue minus luma (B-Y) and red minus luma (R-Y). The terms luma and chroma are often interchanged with luminance and chrominance, respectively, as the difference between these terms is a minor difference having to do with use of gamma corrected or linear pixel signals used in the calculations.

A conventional video camera uses a process referred to as "color space conversion" to convert the RGB data captured by its solid-state sensor into either composite analog signals (YUV) or component versions (analog YPbPr, or digital YCbCr). The difference between YCbCr and RGB is that YCbCr represents color as brightness and two color difference signals, while RGB represents color as red, green and blue. In YCbCr, the Y represents the brightness (luma), Cb represents blue minus luma (B-Y) and Cr represents red minus luma (R-Y). It is desirable in digital cameras to eliminate RGB conversion and accomplish direct detection of digital YCbCr signals within the image sensor. Direct detection of YCbCr within the image sensor eliminates the need for RGB conversion, and may provide better color rendition and increase image sensor dynamic range. While RGB may be the most commonly used basis for color descriptions, it has the negative aspect that each of the coordinates (red, green, and blue) is subject to luminance effects from the lighting intensity of the environment Composite analog signals (YUV) (and analog YPbPr or digital YCbCr) reduce transmission bandwidth compared to RGB because the chroma channels (B-Y and R-Y) carry only half the resolution of the luma. YUV is not compressed RGB; rather, Y, B-Y and R-Y are the mathematical equivalent of RGB. Moving Picture Expert Group (MPEG) compression, which is used in digital video disks (DVDs or, alternatively, digital versatile disk), digital TV and video compact disks (CDs), is coded in YCbCr. Furthermore, digital camcorders (e.g., MiniDV, digital video (DV), Digital Betacam, etc.) output YCbCr over a digital link such as FireWire. The reason for using YCrCb signals is that the human eye is less sensitive to chrominance than luminance. Compression algorithms can take advantage of this phenomenon and subsample the values of Cb and Cr without significant visual degradation of the original color signal.

Despite improvements in solid-state image sensor and digital camera technology, the basic detection mechanism for color cameras is RGB and the detected signal requires reformatting to YCrCb to separate the RGB signals into luminance and chrominance data sets for image compression and resultant image transmission or image data storage. Consequently, there is a need for a digital camera with direct luminance and chrominance detection to eliminate reformatting of RGB signals.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

FIG. 2A is a flow diagram for directly providing an image in YCrCb color space, under an embodiment.

FIG. 3 is a block diagram of a digital camera including four (4) color camera channels to directly acquire YCrCb color channel data, under an embodiment.

FIGS. 14A-14D are schematic exploded representations of one embodiment of an optics portion, under an embodiment.

FIGS. 15A-15C are schematic representations of a sensor array, under an embodiment.

DETAILED DESCRIPTION

Figure 1:
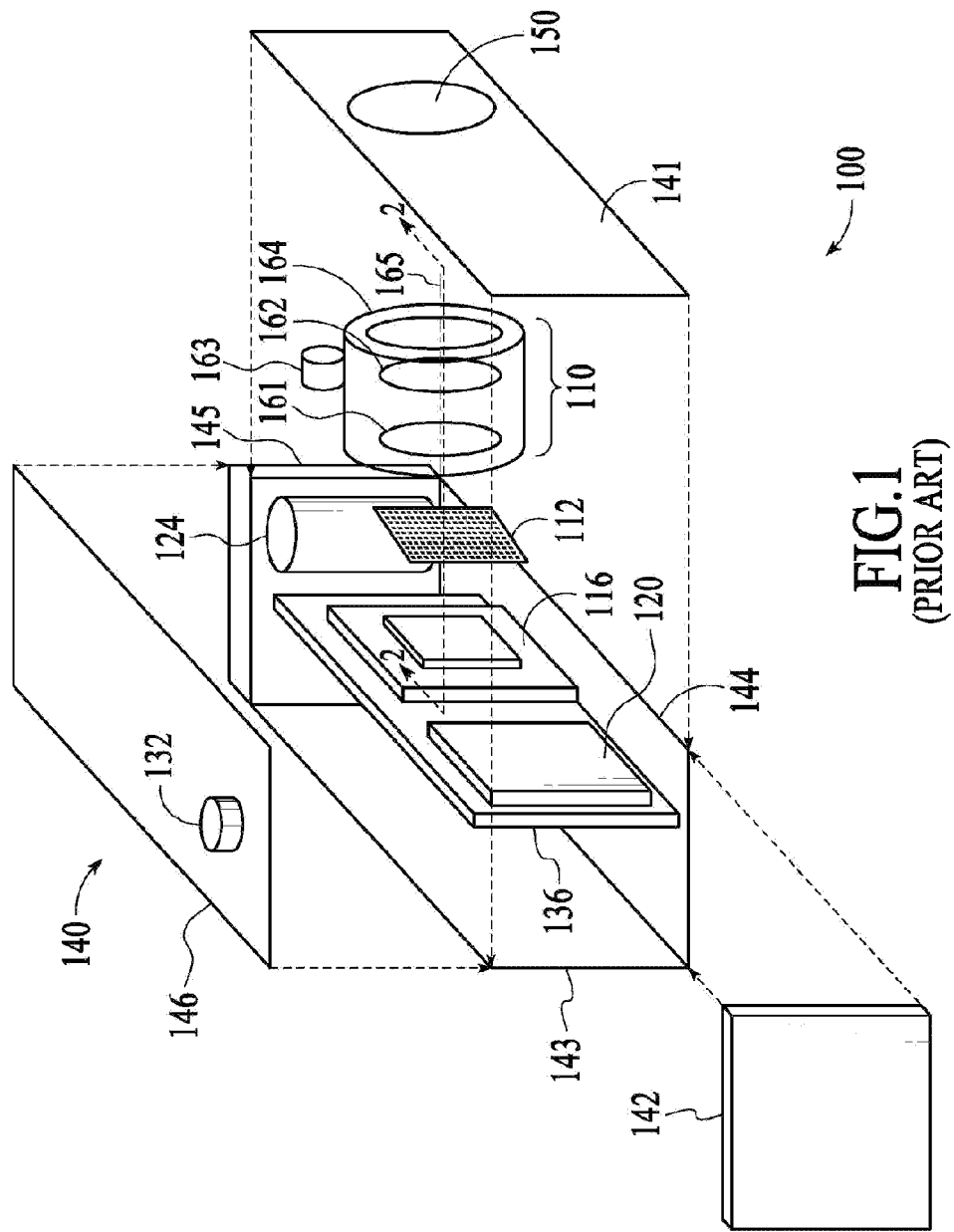
FIG. 1 is a block diagram of a conventional digital camera.

The digital camera systems described below provide a color digital camera with direct luminance detection. The luminance signals are obtained directly from a broadband image sensor channel without interpolation of RGB data. The chrominance signals are obtained from one or more additional image sensor channels comprising red and/or blue color band detection capability. The red and blue signals are directly combined with the luminance image sensor channel signals. The digital camera generates and outputs an image in YCrCb color space by directly combining outputs of the broadband, red and blue sensors. The digital camera systems also include methods for forming a color image with a digital camera comprising two or more image sensor camera channels, each channel having an active area including a plurality of picture elements (pixels) optimized to detect photon wavelengths in bands that directly represent luminance or partial chrominance information.

The digital camera systems of an embodiment provide direct detection of the luminance (Y) and chrominance components Cr and Cb of the digital YCrCb color space widely used in digital imaging and digital image compression. These digital camera systems thus eliminate interpolation in the luminance channel for improved color purity, increase sensitivity in the broadband luminance channel for low light performance, optimize luminance channel design for large dynamic range, and reduce YCrCb color space computation. The digital camera systems detect digital YCrCb or gamma corrected YCrCb (Y'CrCb where Y' is referred to as "luma").

Digital cameras according to the embodiments described herein include two or more closely spaced image sensor camera channels on a common substrate. Each sensor camera channel has its own optics, photo-detection and readout mechanism comprising multiple picture elements (pixels) with independent signal integration time control. The pixel area, including photodetector and circuitry, can be as small as 2 micrometers (μm) by 2 μm. The individual camera channels look at the same field of view but are not so limited.

The digital cameras of an embodiment include multiple (e.g. two or more) closely spaced image sensor camera channels including multiple pixels. One camera channel directly provides luminance data in the sense that no pixel interpretation is performed between R, G, and B pixel data in this channel to generate the luminance data. One or more other camera channels provide blue and red data as appropriate to a configuration of the camera. The combined data from all camera channels provides YCrCb color space data for digital imaging, digital compression, digital storage and transmission.

In the following description, numerous specific details are introduced to provide a thorough understanding of, and enabling description for, embodiments of the digital camera systems. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

FIG. 1 is a block diagram of a conventional digital camera 100. The digital camera 100 generally includes a lens assembly 110, a color filter array layer 112, an image sensor 116, an electronic image storage media 120, and a power supply 124. The digital camera 100 also includes a peripheral user interface 132 (represented as a shutter button), a circuit board 136 (which supports and electrically interconnects the aforementioned components), a housing 140 (including housing portions 141, 142, 143, 144, 145 and 146) and a shutter assembly (not shown), which controls an aperture 150 and passage of light into the digital camera 100. A mechanical frame 164 is used to hold the various parts of the lens assembly 110 together. The lens assembly 110 includes lenses 161, 162 and one or more electro-mechanical devices 163 to move the lenses 161, 162 along a center axis 165. The lenses 161, 162 may be made up of multiple elements arranged together to form an integral optical component. Additional lenses may be employed if necessary. The electro-mechanical device 163 portion of the lens assembly 110 and the mechanical frame 164 portion of the lens assembly 110 may be made up of numerous components and/or complex assemblies.

Digital color cameras use either RGB in one pixel, or Bayer representation in which the pixels are arranged in a 2×2 color filter array pattern where each pixel detects a single color band (R, G or B). The digital camera 100 described above is a camera with a Bayer filter pattern. The color filter array layer 112 has an array of color filters arranged in a Bayer pattern (e.g., a 2×2 matrix of colors with alternating red and green in one row and alternating green and blue in the other row, although other colors may be used). The Bayer pattern is repeated throughout the color filter array.

The image sensor 116 contains a plurality of identical photo detectors (sometimes referred to as "picture elements" or "pixels") arranged in a matrix. The number of photo detectors is usually in range of hundreds of thousands to millions. The lens assembly 110 spans the diagonal of the array.

Each of the color filters in the color filter array 112 is disposed above a respective one of the photo detectors in the image sensor 116, such that each photo detector in the image sensor receives a specific band of visible light (e.g., red, green or blue) and provides a signal indicative of the color intensity thereof. Conversion of an image from this signal format to an RGB format makes use of an interpolation of the two missing color values in each pixel. Several standard interpolation methods (e.g. nearest neighbor, linear, cubic, cubic spline, etc.) can be used. Signal processing circuitry (not shown) receives signals from the photo detectors, processes them (interpolation), and ultimately outputs a color image in RGB and other desired digital formats such as YCrCb.

In conventional interpolation operations, luminance (Y) is calculated for each interpolated pixel as $$Y=0.299R+0.587G+0.114B.$$

The two chrominance values (Cr (red chroma) and Cb (blue chroma)) for each interpolated pixel are calculated as $$Cr=0.713(R-Y)=0.500R-0.419G-0.081B,$$

and $$Cb=0.564(B-Y)=-0.169R-0.331G+0.500B.$$

The peripheral user interface 132, which includes the shutter button, may further include one or more additional input devices (e.g., for settings, controls and/or input of other information), one or more output devices, (e.g., a display for output of images or other information) and associated electronics.

Figure 2:
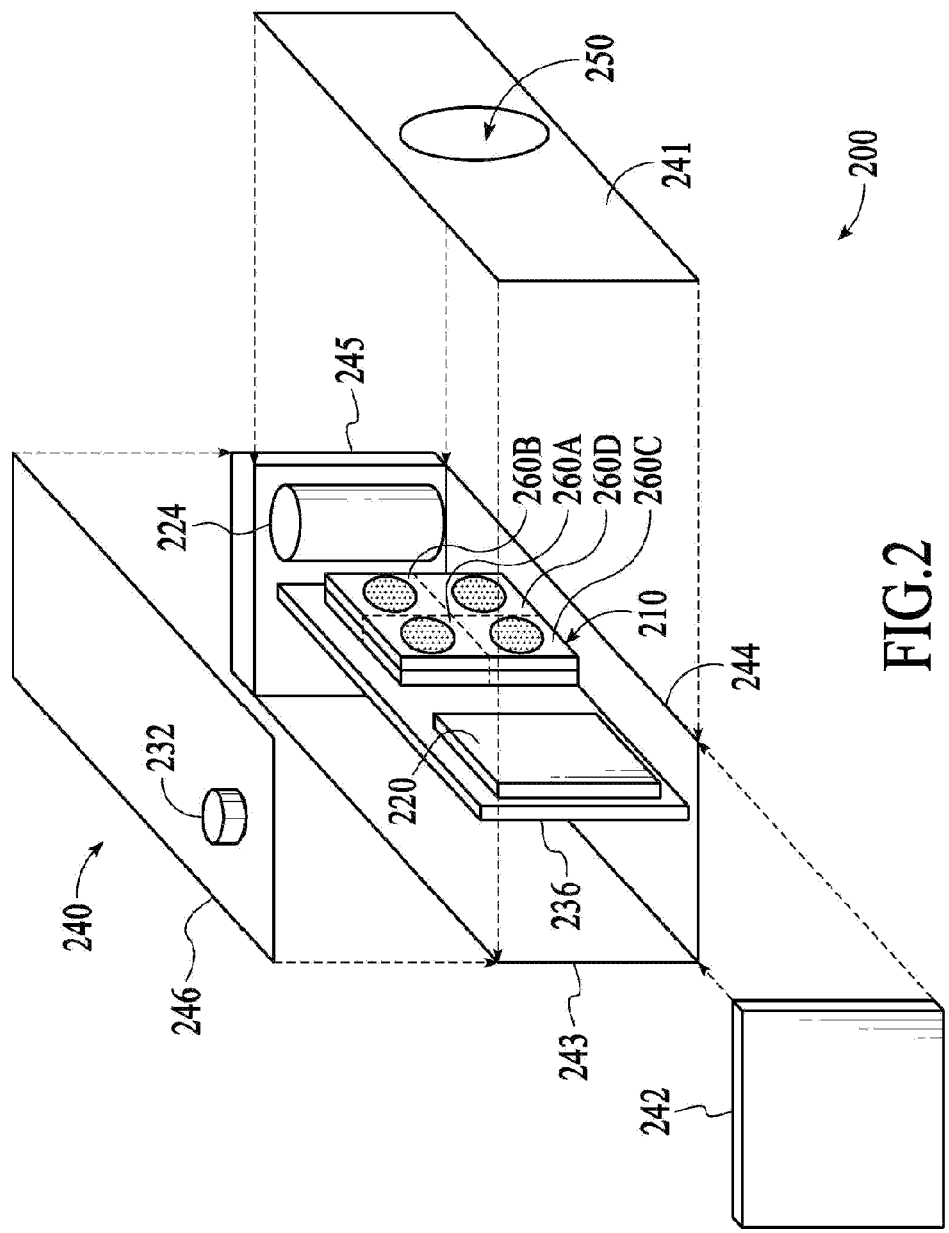
FIG. 2 is a block diagram of a digital camera having direct luminance and chrominance detection, under an embodiment.

In contrast to the conventional camera that provides luminance data through interpolation of R, G, and B pixel data, FIG. 2 is a block diagram of a digital camera 200 having direct luminance and chrominance detection, under an embodiment. The digital camera 200 of an embodiment is configured as a color digital camera with direct luminance detection. The digital camera 200 has multiple camera channels, with some portion of the channels configured for color imaging and some portion of the channels configured for (broadband) luminance imaging, under an embodiment. The luminance signals are received or obtained from a broadband image sensor channel that is a first set or portion of the camera channels of the digital camera 200. Chrominance signals are received or obtained from one or more additional image sensor channels containing red and blue color band detection capability when the red and blue signals are directly combined with the luminance image sensor channel signals. The additional image sensor channel(s) are a second set or portion of the camera channels of the digital camera 200.

The digital camera 200 includes one or more methods for forming a color image with a digital camera comprising two or more image sensor camera channels. Each of the camera channels includes an active area comprising a plurality of picture elements (pixels) optimized to detect photon wavelengths in bands that directly represent luminance or partial chrominance information. Generally, the digital camera 200 directly detects the luminance (Y) and chrominance components (Cr and Cb) of the digital YCrCb color space widely used in digital imaging and digital image compression. The digital camera 200 of an embodiment, by directly detecting luminance and chrominance information, eliminates interpolation in the luminance channel for improved color purity, increased sensitivity in the broadband luminance channel for low light performance, optimized luminance channel design for large dynamic range, and reduced YCrCb color space computation. The digital camera 200 detects digital YCrCb or gamma-corrected YCrCb (Y'CrCb where Y' is referred to as "luma").

More particularly, FIG. 2A is a flow diagram for directly providing an image in YCrCb color space 290, under an embodiment. The YCbCr color space is one in which color is represented as brightness and two color difference signals. The luminance data represents a photometric measure of the brightness or density of luminous intensity received at the sensor from an image. In YCbCr, therefore, the brightness (luma) is represented by Y, and the two color difference signals or components include a blue chroma component represented by Cb (blue minus luma (B−Y)) and a red chroma component represented by Cr (red minus luma (R−Y)).

In operation, and with reference to FIG. 2A, components of the camera or an embodiment are configured and function to directly detect luminance data 292 using a broadband wavelength response without the use of RGB color data. Chrominance data is generated 294 directly by detecting red color band data and blue color band data.

Chrominance is generally represented as two color difference components. Therefore, a red chroma component is generated by directly combining the red color band data with the luminance data (e.g., subtraction operation in which luminance data is subtracted from red color band data). Similarly, a blue chroma component is generated by directly combining the blue color band data with the luminance data (e.g., subtraction operation in which luminance data is subtracted from blue color band data). The camera components output 296 an image in YCrCb color space using the luminance and chrominance data.

Referring to FIG. 2, the digital camera 200 of an embodiment includes two or more closely spaced image sensor camera channels on a common substrate. Each sensor camera channel has its own optics, photo-detection and readout mechanism comprising multiple picture elements (pixels) with independent signal integration time control. The individual camera channels look at the same field of view but are not so limited. The closely spaced image sensor camera channels include multiple pixels. One or more of the camera channels can be used to provide blue and red data, for example, and a separate camera channel provides luminance data. The combination of data from all camera channels provides YCrCb color space data from digital imaging, digital compression, digital storage and transmission.

As an example, the digital camera 200 includes a digital camera subsystem 210, an electronic image storage media 220, a power supply 224, and a peripheral user interface 232. The peripheral user interface 232 of an embodiment is represented as a shutter button, but is not so limited. The digital camera 200 includes a circuit board 236 which, in an embodiment, supports and/or electrically interconnects one or more other components of the digital camera 200. The digital camera 200 includes a housing 240, including housing portions 241, 242, 243, 244, 245 and 246, and a shutter assembly (not shown). The shutter assembly controls for example an aperture 250 and passage of light into the digital camera 200.

The digital camera subsystem 210, also referred to herein as the "DCS" 210, includes one or more camera channels. The subsystem 210 of this example embodiment includes four camera channels 260A-260D but alternative embodiments are not limited to four camera channels and can include any number of camera channels. The DCS 210 of an embodiment replaces and/or fulfills one, some or all of the roles fulfilled by the lens assembly 110, the color filter 112 and the image sensor 116 of the digital camera 100 described above with reference to FIG. 1. The four camera channels 260A-260D provide four separate color imaging bands. For example, channel 260A images the red color band, channel 260B images the green color band, channel 260C images the blue color band, and channel 260D images the white (broadband) color band. In some imaging applications, to match the human eye spectral response, channel 260D will image wavelengths approximately in the range of 400 nm to 700 nm, while in other imaging applications the spectral band of channel 260D can change. For example, the channel 260D can be configured to image or detect data approximately in a range of 250 nm up to 1060 nm. As another example, the channel 260D can be configured to image or detect data approximately in a range of 400 nm up to 1060 nm. Since each camera channel images in only one color band, pixel interpolation such as that described for use in digital camera 100 described above is not required.

Camera channel 260D can be used to directly sense and output luminance (Y) values from the image. The camera channel 260D can be configured and functions to accommodate the larger signal level associated with the wider broadband wavelength imaging band. The use of a separate camera channel for obtaining luminance provides increased dynamic range and improved low light level sensitivity.

Camera channels 260A and 260C collect R and B pixel data, respectively, for use along with the luminance Y data of camera channel 260D in generating chrominance (Cr and Cb) information or data as described above. Additionally, camera channels 260A, 260B and 260C can be used to collect R, G and B pixel data respectively, for example. The output of channels 260A and 260C can be used to generate chrominance, as well as being used along with the output of channel 260B to provide a direct output of RGB signals from the camera. The RGB signals are output in addition to the YCrCb signals described herein.

The peripheral user interface 232, which includes the shutter button, may further include one or more additional input devices (e.g., for settings, controls and/or input of other information), one or more output devices, (e.g., a display for output of images or other information), and associated electronics. The electronic image storage media 220, power supply 224, peripheral user interface 232, circuit board 236, housing 240, shutter assembly (not shown), and aperture 250, may be, for example, similar to the electronic image storage media 120, power supply 124, peripheral user interface 132, circuit board 136, housing 140, shutter assembly (not shown), and aperture 150 of the digital camera 100 described above.

FIG. 3 is a block diagram of a digital camera subsystem 210, under an embodiment. The DCS 210 includes one or more camera channels (e.g., four camera channels 260A-260D) but is not so limited. Each of the camera channels 260A-260D includes an optics portion and a sensor portion as described above with reference to FIG. 2. The sensor portions of the one or more camera channels are collectively referred to herein as a sensor subsystem. Each camera channel has a selectable integration time, and the integration time setting between camera channels can be different. The integration time adjustment can be used to provide optimum signal to noise ratio (SNR) and dynamic range in each of the color imaging bands of the multiple channels (e.g., channels 260A, 260B, 260C and 260D).

The digital camera system 210 further includes a processor. The processor includes an image processor portion 270 or component (hereafter image processor 270) and a controller portion 300 (hereafter controller 300 or YCrCb controller 300). The controller portion 300 is part of the luminance and chrominance signal capability that is obtained from the combined outputs of the different camera channels. The processor 270 is coupled to the one or more sensor portions, e.g., sensor portions 292A-292D, via one or more communication links, represented by a signal line 330.

A communication link, coupling, or connection may be any kind of communication link including but not limited to, for example, wired couplings (e.g., conductors, fiber optic cables), wireless couplings (e.g., acoustic links, electromagnetic links or any combination thereof including but not limited to microwave links, satellite links, infrared links), and combinations of wired and/or wireless links or couplings.

A description follows of the operation of the DCS of an embodiment. A user of the host digital camera selects a desired incident light range and the camera automatically adjusts the integration time setting between the camera channels to give an optimal dynamic range result. Alternatively the camera can automatically adjust integration time control in each channel to provide a desired output signal level looking at the raw R, G, B and W pixel data and adjusting to a desired signal level in each channel. The R, G, B and W digital output levels can be adjusted for integration time, dark current offset, responsivity and color balance prior to Y, Cr and Cb calculation. The camera can output YCrCb directly from the W, R and B color channels and RGB directly from the R, G and B color channels.

Figure 4:
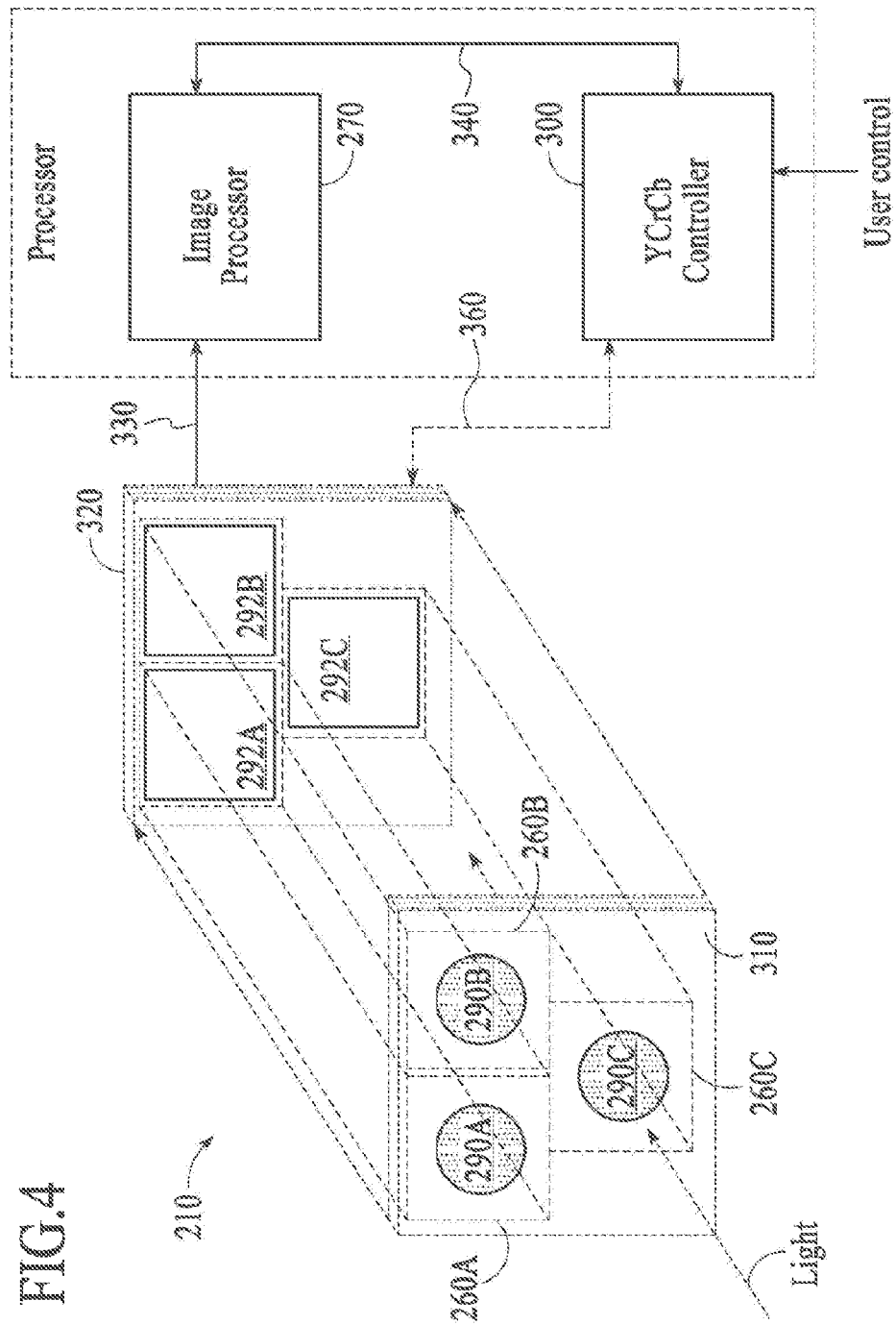
FIG. 4 is a block diagram of a digital camera including three (3) color camera channels to directly acquire YCrCb color channel data, under an embodiment.

In another embodiment, as shown in FIG. 4, three camera channels are used to directly acquire YCrCb color channel data. Camera channel 260A is configured for R light, channel 260B is configured for B light, and channel 260C is configured for W light. Interpolation is not required in an embodiment because each camera channel has only one color pixel, but the embodiment is not so limited. The integration time of channel 260A is configured for R band light, the integration time of channel 260B is configured for B band light, and the integration time of channel 260C is configured for W band light levels. Alternative layout architectures are possible with the three camera channels as shown in FIG. 4, such as a 1.times.3 vertical or a 1×3 horizontal; however the triangular layout configuration, as shown, has area reduction advantages in imager layout and processing on semiconductor wafers. The triangular layout, as shown in FIG. 4, also provides optical symmetry between the channels. The R and B pixel data from camera channels 260A and 260B respectively and Y chrominance data from camera channel 260C are used calculate Cr and Cb components directly as described herein.

Figure 5:
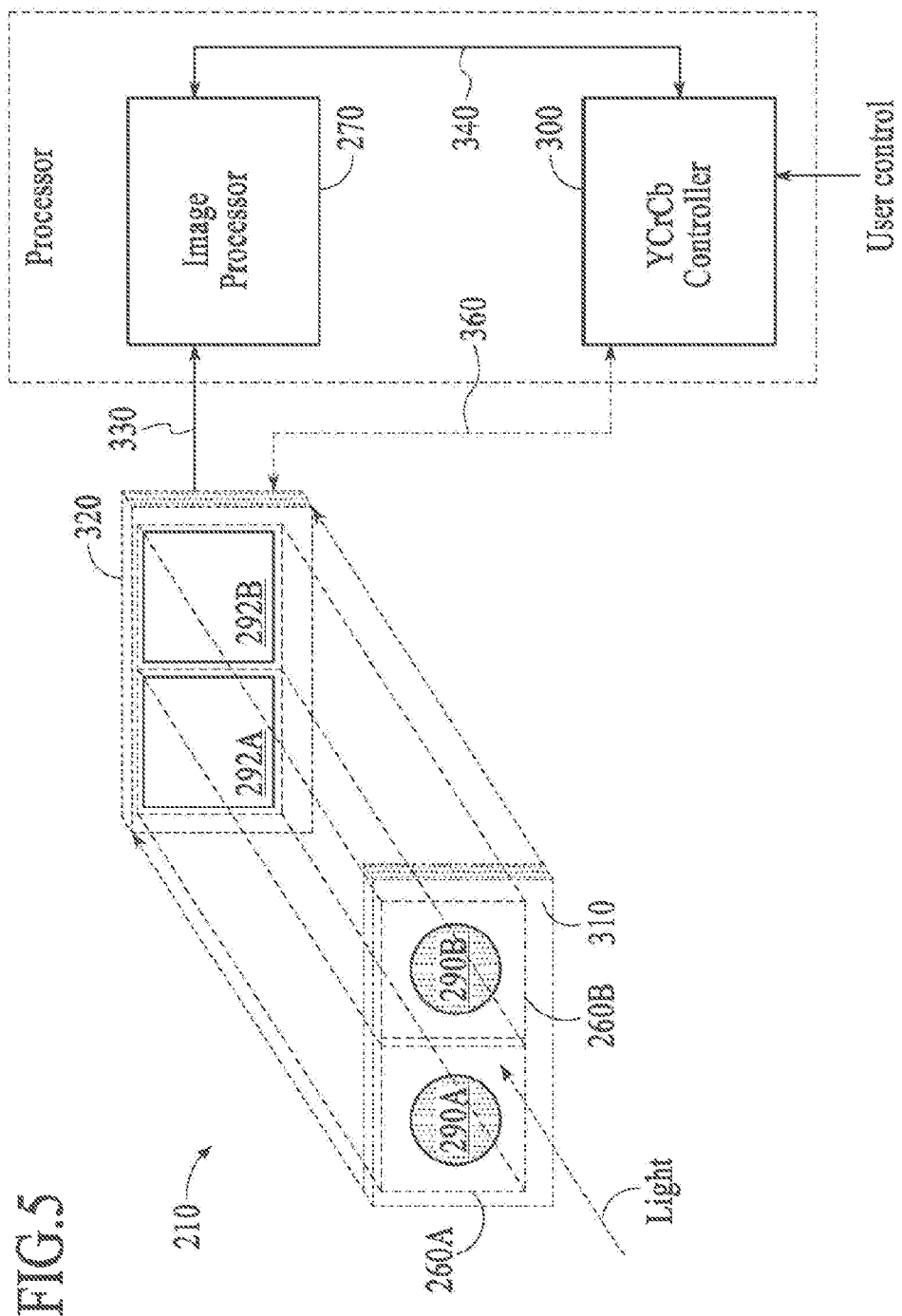
FIG. 5 is a block diagram of an example digital camera including two (2) color camera channels to directly acquire YCrCb color channel data, under an embodiment.

In another embodiment, as shown in FIG. 5, two camera channels are used to directly acquire YCrCb color channel data. Camera channel 260A is configured for R and B color band detection. The camera channel can use a color filter array approach (50% R and 50% B with alternation color bands on adjacent pixels) or use a pixel configuration with two-color (R and B) detection capability within each pixel. In the case of the color filter array, pixel interpolation among R and B data is used to achieve full chrominance resolution. A 1×2 vertical layout or 1×2 diagonal layout of camera channels is also possible under an embodiment. The integration time of channel 260A is configured for R and B band light, and the integration time of channel 260B is configured for W band light levels. The R and B pixel data from camera channels 260A and 260B respectively and Y chrominance data from camera channel 260C are used calculate Cr and Cb components directly.

Figure 6:
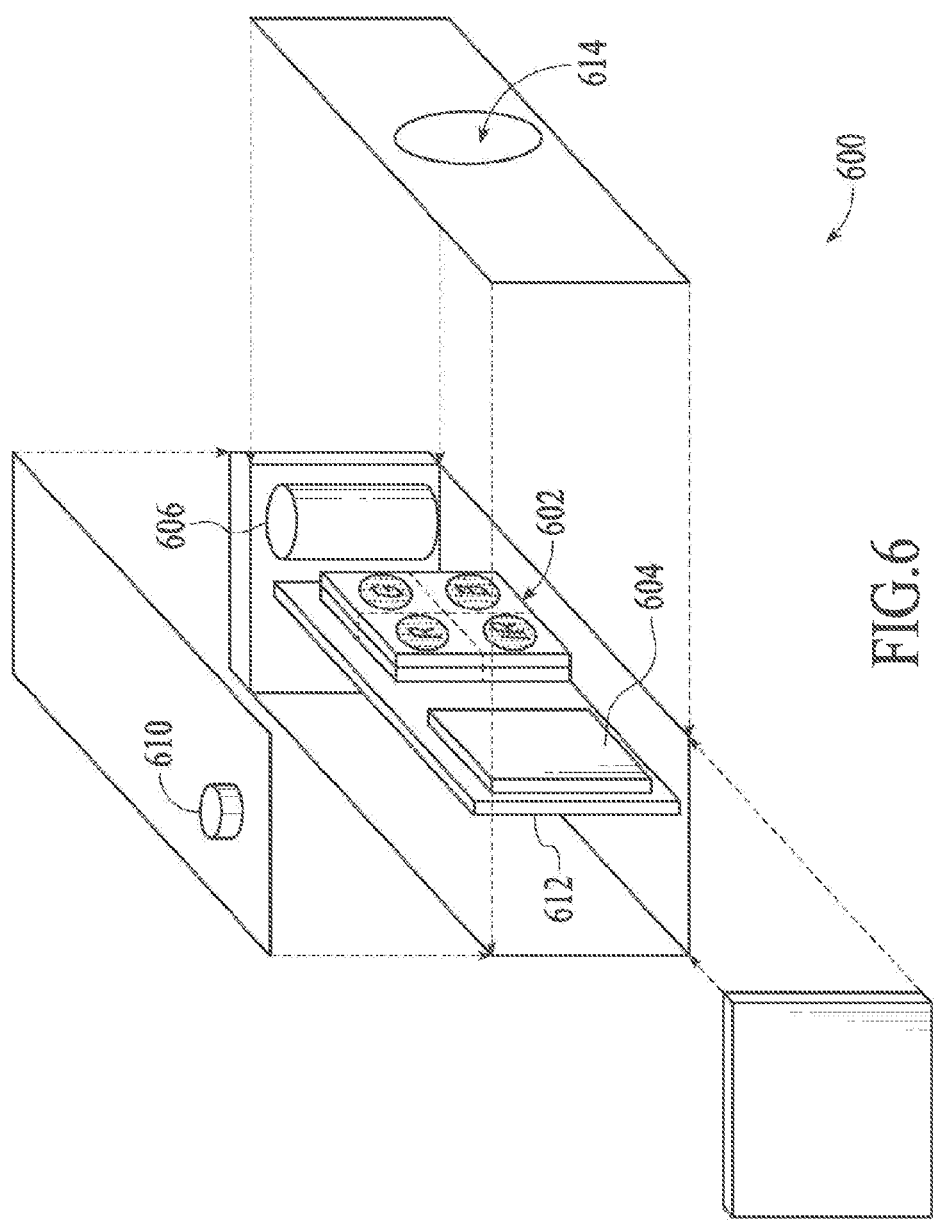
FIG. 6 is a block diagram of a digital camera, under an embodiment.

FIGS. 6-19 illustrate further examples of apparatus and systems in which the imaging module and focusing method embodiments disclosed above can be implemented. FIG. 6 is a block diagram of a digital camera 600, under an embodiment. The digital camera includes a digital camera subsystem 602, a circuit board 612, a peripheral user interface electronics 610 (here represented as a shutter button, but could also include display and/or one or more other output devices, setting controls and/or one or more additional input devices etc), a power supply 606, and electronic image storage media 604. The digital camera 600 may further include a housing and a shutter assembly (not shown), which controls an aperture 614 and passage of light into the digital camera 600.

Figure 7:
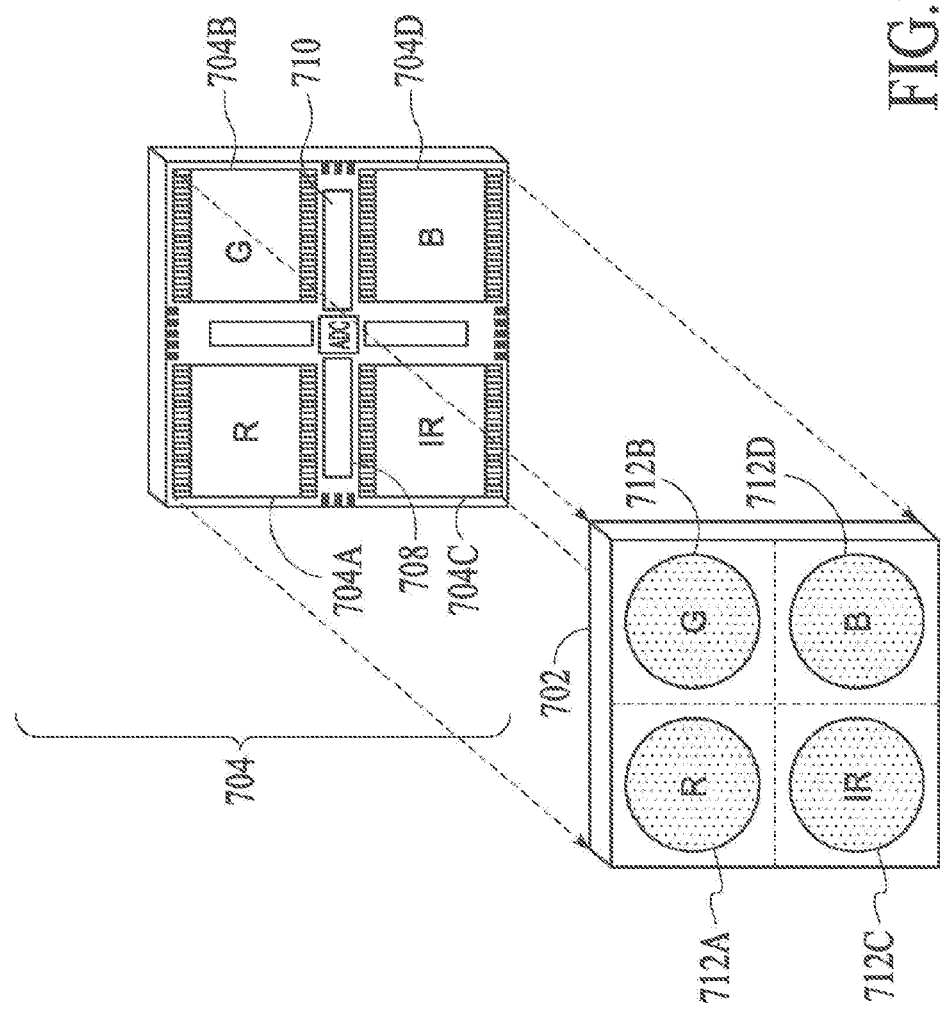
FIG. 7 is an exploded view of a digital camera subsystem, under an embodiment.

FIG. 7 is an exploded view of the digital camera subsystem 602, under an embodiment. In this embodiment, the digital camera subsystem includes an image sensor 704, an optics frame (also referred to as a frame) 702, and lenses 712A-712D. The frame 702 is used to mount the lenses 712A-712D to the image sensor 704. The image sensor, or imager die 704 generally includes a semiconductor integrated circuit or "chip" having several higher order features including multiple arrays 704A-704D and signal processing circuits 708 and 710. Each of the arrays 704A-704D captures photons and outputs electronic signals. The signal processing circuit 708, in certain embodiments, processes signals for each of the individual arrays 704. The signal processing circuit 710 may combine the output from signal processing 708 into output data (usually in the form of a recombined full color image). Each array and the related signal processing circuitry may be tailored to address a specific band of visible spectrum. The imaging sensor 704 shows a single analog-to-digital conversion (ADC) however separate ADCs can be used for each channel located at the array output, array column signal outputs or within each pixel of the arrays 704.

Each of lenses 712A-712D may be tailored for the respective wavelength of the respective array. Lenses are approximately the same size as the underlying array 704, and will differ from one another in size and shape depending upon the dimensions of the underlying array and the wavelength the array is configured to receive. In alternative embodiments a lens could cover only a portion of an array, and could extend beyond the array. Lenses can comprise any suitable material or materials, including for example, glass and plastic. Lenses can be doped in any suitable manner, such as to impart a color filtering, polarization, or other property. Lenses can be rigid or flexible.

In the example of FIG. 7, each lens, array, and signal processing circuit constitutes an image generating subsystem for a band of visible spectrum (e.g., red, blue, green, etc). These individual images are then combined with additional signal processing circuitry within the semiconductor chip to form a full image for output.

Figure 8:
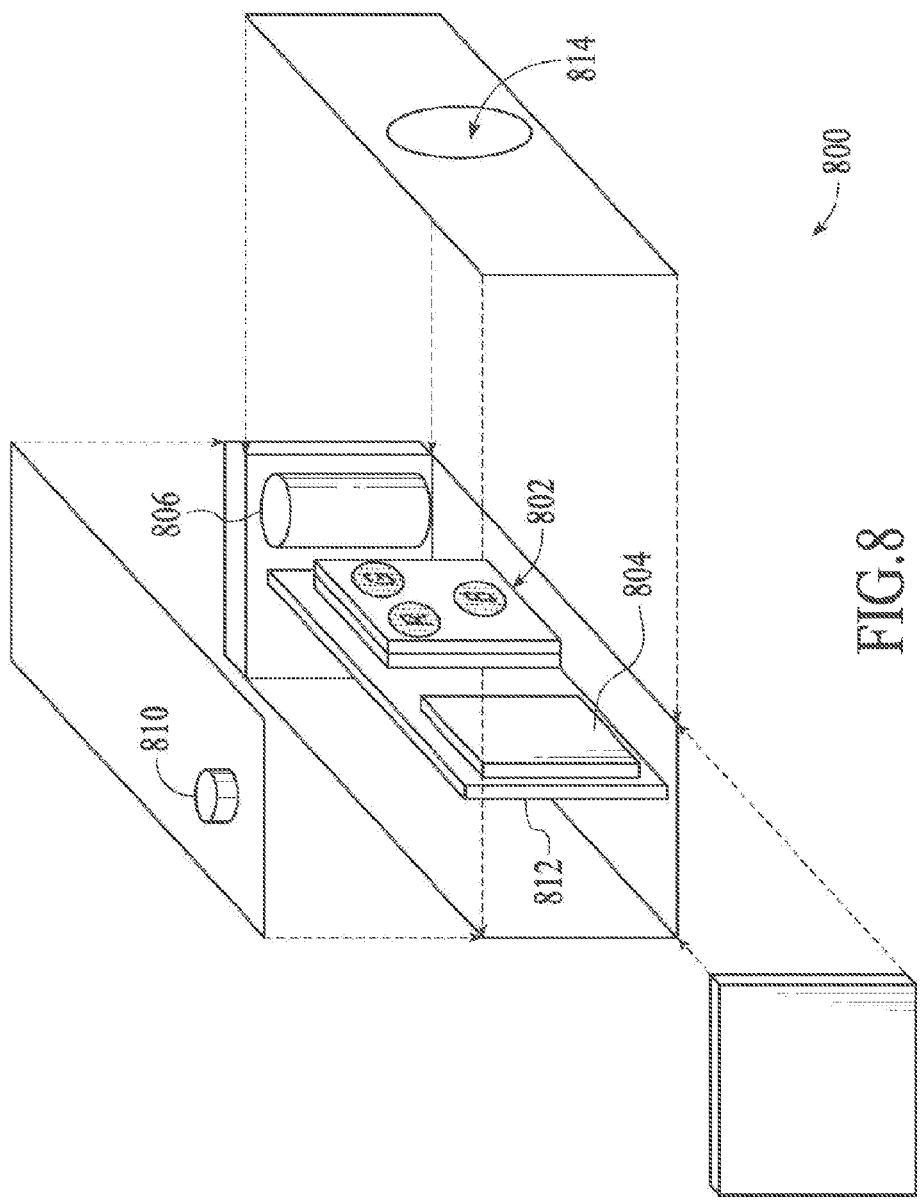
FIG. 8 is a block diagram of a digital camera having a three array/lens configuration, under an embodiment.

Although the digital camera subsystem 704 is depicted in a four array/lens configuration, the digital camera subsystem can be employed in a configuration having any number of arrays/lenses and any combination of shapes of arrays/lenses. FIG. 8 is a block diagram of a digital camera 800 having a three array/lens configuration, under an embodiment. The digital camera 800 includes a digital camera subsystem 802 that includes three lenses. The digital camera 800 further includes a circuit board 812, a peripheral user interface electronics 810 (here represented as a shutter button, but could also include display and/or one or more other output devices, setting controls and/or one or more additional input devices etc), a power supply 806, and electronic image storage media 804. The digital camera 800 may further include a housing and a shutter assembly (not shown), which controls an aperture 814 and passage of light into the digital camera 800.

Figure 9:
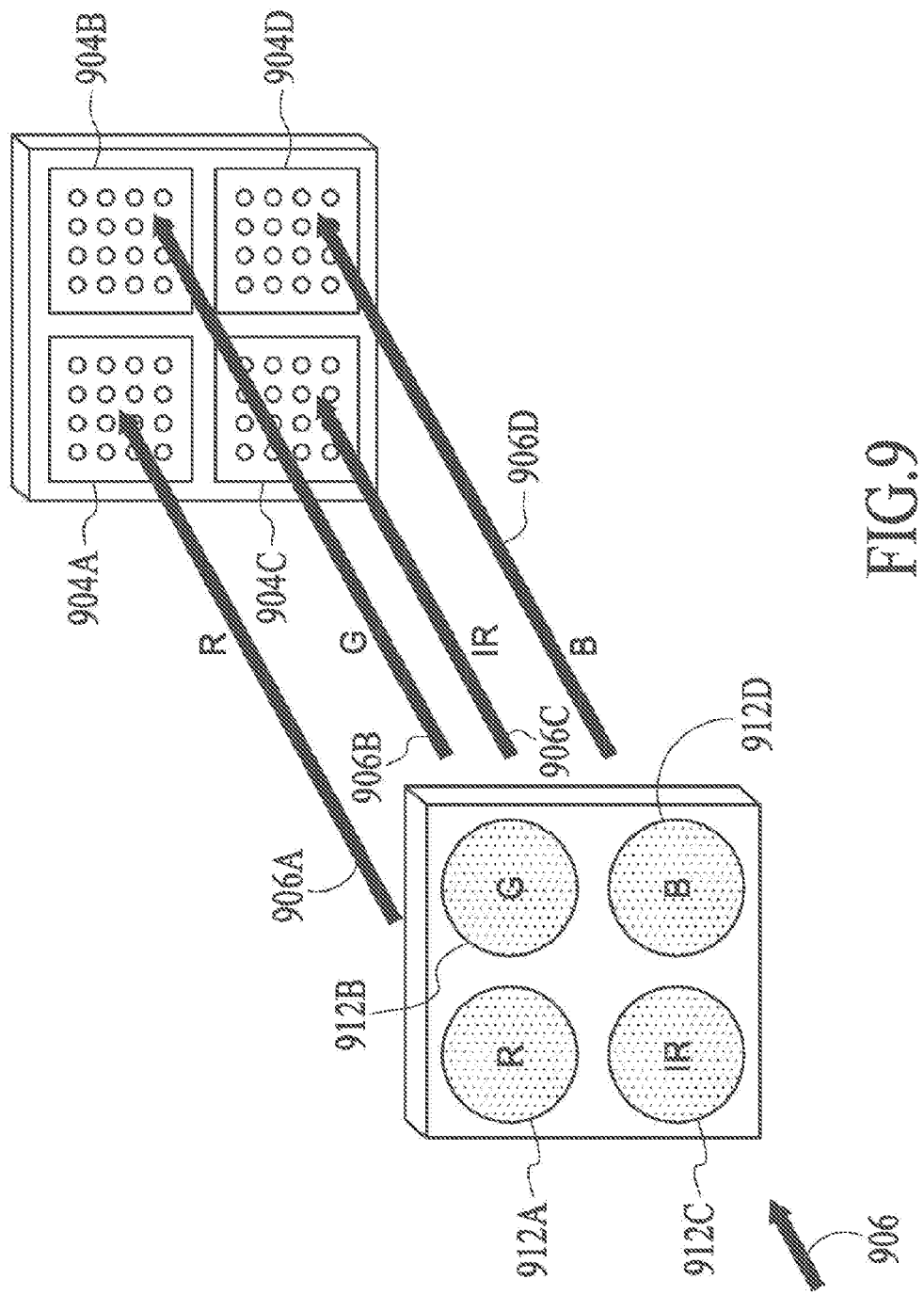
FIG. 9 is a block diagram of a digital camera subsystem that employs separate arrays on one image sensor, under an embodiment.

FIG. 9 is a block diagram of a digital camera subsystem that employs separate arrays, e.g., arrays 904A-904D, on one image sensor, in contrast to the prior art. For example, typical prior art approaches employ a Bayer pattern (or variations thereof), perform operations across the array (a pixel at a time), and integrate each set of four pixels (for example, red/green/blue/green or variation thereof) from the array into a single full color pixel.

Each of the arrays 904 focuses on a specific band of visible spectrum. Each lens only needs to pass a respective color (906A-906D) on to the image sensor. The traditional color filter sheet is eliminated. Each array 904 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

As such, each array may be configured or optimized to be more efficient in capturing and processing the image in that particular color. Individual lenses (912A-D) can be tailored for the array's band of color spectrum.

Figure 10:
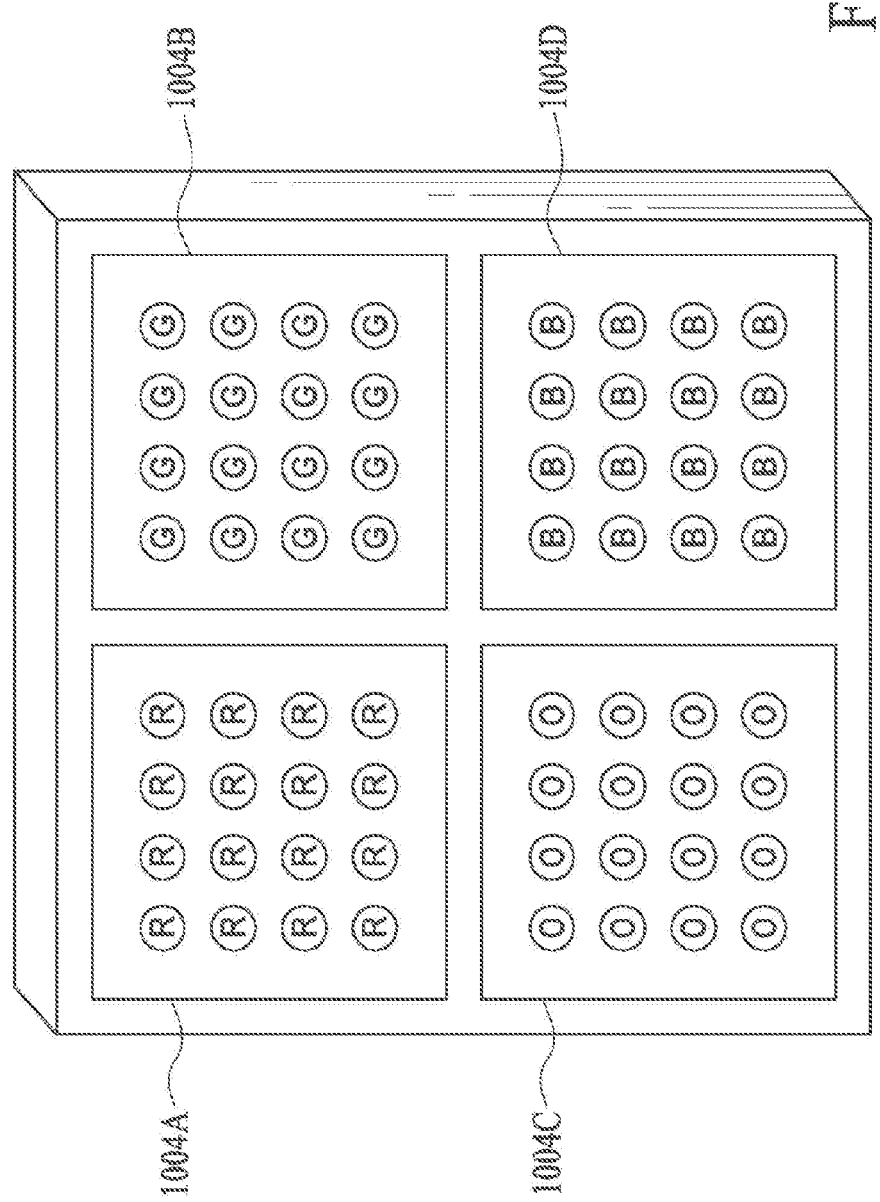
FIG. 10 is a block diagram of arrays, each of which receives a respective color as passed by a respective lens, under an embodiment.

FIG. 10 is a block diagram of arrays 1004A-1004D. Each array 1004 receives a respective color as passed by a respective lens. The traditional color filter sheet is eliminated. Each array 1004 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

Figure 11:
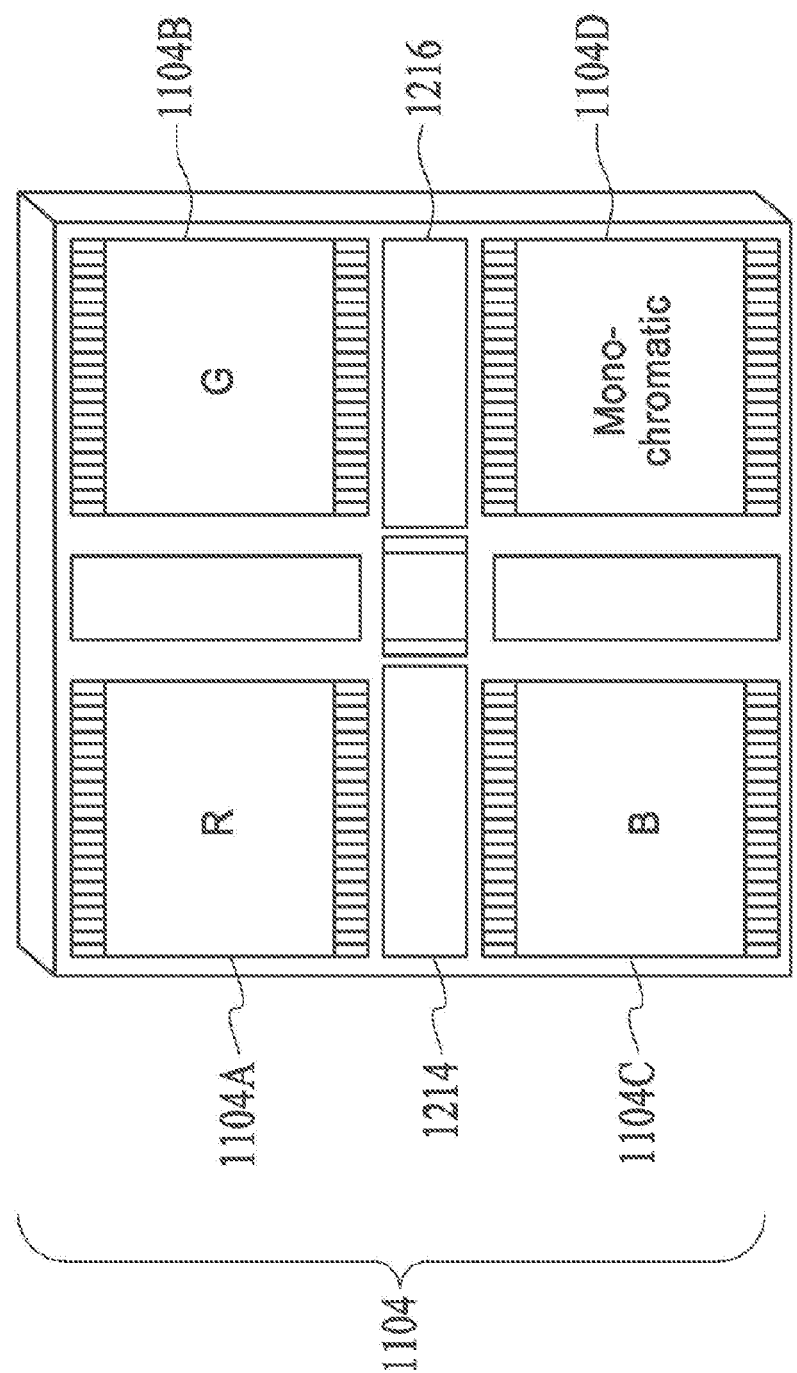
FIG. 11 is a block diagram of processing circuitry of a digital camera subsystem, under an embodiment.

FIG. 11 is a block diagram of processing circuitry of a digital camera subsystem, under an embodiment. FIG. 11 includes an array 1104, including arrays 1104A-1104D, and signal processing circuitry (also referred to as image processing circuitry) 1214 and 1216. Each array outputs signals to signal processing circuitry.

Figure 12:
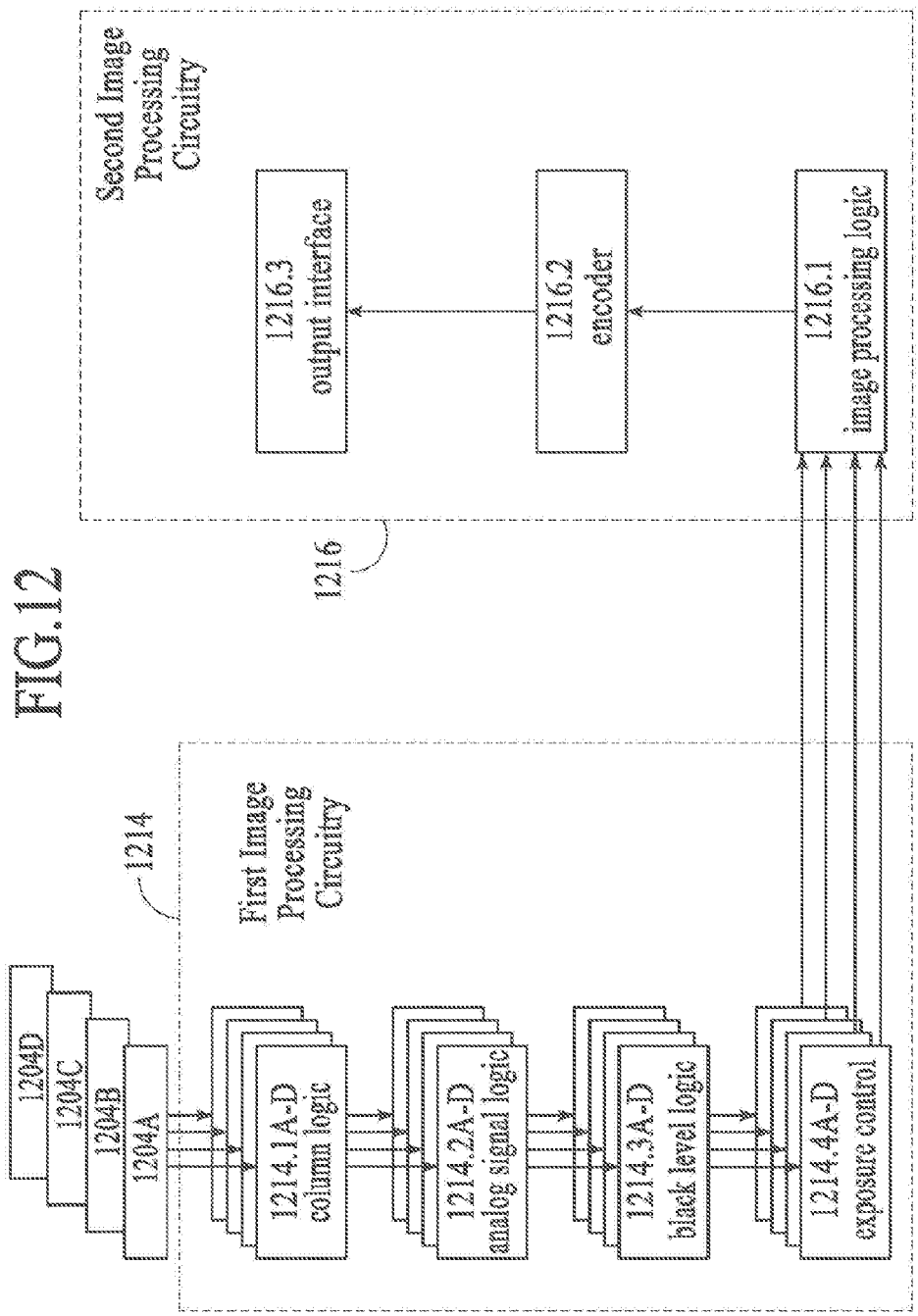
FIG. 12 is a block diagram of signal processing circuitry, under an embodiment.

FIG. 12 is a block diagram of image processing circuitry 1214 and 1216. Within the image processing circuitry 1214, each array can be processed separately to tailor the processing to the respective bands of spectrum.

Column logic 1214.1A-1214.1D is the portion of the signal processing circuitry that reads the signals from the pixels. For example, the column logic 1214.1A reads signals from the pixels in array 1204A. Column logic 1214.1B reads signals from the pixels in array 1204B. Column logic 1214.1C reads signals from the pixels in array 1204C. Column logic 1214.1D reads signals from the pixels in array 1204D.

Since an array is targeting a specific wavelength, wavelengths, band of wavelength, or band of wavelengths, the column logic may have different integration times for each array enhancing dynamic range and/or color specificity. Signal processing circuitry complexity for each array can be substantially reduced since logic may not have to switch between extreme color shifts.

Analog Signal Logic (ASL) 1214.2A-1214.2D for each array may be color specific. As such, the ASL processes a single color and therefore can be optimized for gain, noise, dynamic range, linearity, etc. Due to color signal separation, dramatic shifts in the logic and settling time are not required as the amplifiers and logic do not change on a pixel by pixel (color to color) basis as in traditional Bayer patterned designs. Alternatively, digital logic may be used instead of or in combination with the ASL (e.g., arrays including ADCs at the column level). In some configurations, for example, where the ADC is external to the column then digital signal logic would be used with digital signal processing from this point onwards in the processing chain.

Black level control 1214.3A-1214.3D assesses the level of noise within the signal, and filters it out. With each array focused upon a narrower band of visible spectrum than traditional image sensors, the black level control can be more finely tuned to eliminate noise.

Exposure control 1214.4A-1214.4D measures the overall volume of light being captured by the array and adjusts the capture time for image quality. Traditional cameras must make this determination on a global basis (for all colors). The embodiments describe herein allow for exposure control to occur differently for each array and targeted band of wavelengths.

These processed images are then passed to a second group of signal processing circuitry 1216. First, image processing logic 1216.1 integrates the multiple color planes into a single color image. The image is adjusted for saturation, sharpness, intensity, hue, artifact removal, and defective pixel correction.

In an embodiment, the final two operations include encoding the signal into standard protocols such as MPEG, JPEG, etc. in an encoder 1216.2 before passing the result to a standard output interface 1216.3, such as USB.

Although the signal processing circuitries 1214 and 1216 are shown at specific areas of the image sensor, the signal processing circuitries 1214 and 1216 can be placed anywhere on the chip and subdivided in any fashion. The signal processing circuitries are often placed in multiple locations. While some signal processing can be accomplished in analog format, signals can be digitized and signal processing accomplished in digital format.

As previously stated, the image sensor 1204 generally includes a semiconductor chip having several higher order features including multiple arrays (1204A-1204D), and signal processing circuitry 1214, in which each array and the related signal processing circuitry is preferably tailored to address a specific band of visible spectrum. As noted above, the image sensor array can be configured using any multiple numbers and shapes of arrays.

The image sensor 1204 can be constructed using any suitable technology, including silicon and germanium technologies. The pixels can be formed in any suitable manner, can be sized and dimensioned as desired, and can be distributed in any desired pattern. Pixels that are distributed without any regular pattern may also be used.

Any range of visible spectrum can be applied to each array depending on the specific interest of the customer or application. Further, an infrared array could also be employed as one of the array/lens combinations giving low light capabilities to the sensor.

As previously described, arrays 1204A-1204D may be of any size or shape. While some figures referenced herein show the arrays as individual, discrete sections of the image sensor, these arrays may also be touching. There may also be one large array configured such that the array is subdivided into sections, and each section is focused upon one band of spectrum, creating the same effect as separate arrays on the same chip.

Although the well depth (photon collection depth) of the photo detectors across each individual array 1204 may be the same, the well depth of any given array may be different from that of other arrays of the sensor subsystem. A photo detector includes an area or portion of the photo detector that captures, collects, is responsive to, detects and/or senses the intensity illumination of incident light. In some embodiments, the well depth starts at the surface of the photo detector and proceeds into a doped semiconductor region, in other embodiments the well depth is located within a buried region of the semiconductor.

Selection of an appropriate well depth depends on many factors, including the targeted band of visible spectrum. Since each entire array is likely to be targeted at one band of visible spectrum (e.g., red) the well depth can be configured to capture that wavelength and ignore others (e.g., blue, green). Doping of the semiconductor material in the color specific arrays can further be used to enhance the selectivity of the photon absorption for color-specific wavelengths.

In various embodiments, a digital camera subsystem can have multiple separate arrays on a single image sensor, each with its own lens. The simple geometry of smaller, multiple arrays allows for a smaller lenses (e.g., smaller diameter, thickness and focal length), which allows for reduced stack height in the digital camera.

The lens and frame concept is applicable to traditional image sensors (without the traditional color filter sheet) to gain physical size, cost and performance advantages.

Each array can advantageously be focused on one band of visible and/or detectable spectrum. Among other things, each lens may be tuned for passage of one specific band of wavelength. Since each lens would therefore not need to pass the entire light spectrum, the number of elements may be reduced, for example, to one or two from three or more lenses.

Further, due to the focused bandwidth for each lens, each of the lenses may be dyed (doped) during the manufacturing process for its respective bandwidth (e.g., red for the array targeting the red band of visible spectrum). Alternatively, a single color filter may be applied across each lens. This process eliminates the traditional color filters (such as the sheet of individual pixel filters) thereby reducing cost, improving signal strength and eliminating the pixel reduction barrier.

The above-described devices can include any suitable number of combinations, including as few as two arrays/lenses, and many more than two arrays/lenses. Examples include: two arrays/lenses configured as red/green and blue; two arrays/lenses configured as red and blue/green; two arrays/lenses configured as red, green, blue; four arrays/lenses configured as red, blue, green, emerald (for color enhancement); four arrays/lenses configured as red, blue, green, infrared (for low light conditions); and eight arrays/lenses configured as double the above configurations for additional pixel count and image quality.

The cameras or camera subsystems described herein are intended to be emblematic of a generic appliance containing the digital camera subsystem. Thus, the description herein should be interpreted as being emblematic of still and video cameras, cell phones, other personal communications devices, surveillance equipment, automotive applications, computers, manufacturing and inspection devices, toys, plus a wide range of other and continuously expanding applications. Of course these alternative interpretations may or may not include the specific components as depicted herein. For example, the circuit board may not be unique to the camera function but rather the digital camera subsystem may be an add-on to an existing circuit board, such as in a cell phone.

Any or all of the methods and/or apparatus disclosed herein may be employed in any type of apparatus or process including, but not limited to still and video cameras, cell phones, other personal communications devices, surveillance equipment, automotive applications, computers, manufacturing and inspection devices, toys, plus a wide range of other and continuously expanding applications.

Although each array and the related signal processing circuitry is can be tailored to address a specific band of visible spectrum, and each lens may be tuned for passage of that one specific band of wavelength, there is no requirement that each such array and the related signal processing circuitry be tailored to address a specific band of the visible spectrum. Nor is there any requirement that each lens be tuned for passage of a specific band of wavelength or that each of the arrays be located on the same semiconductor device. Indeed, the embodiments described and illustrated herein, including the specific components thereof, need not employ wavelength-specific features. For example, the arrays and/or signal processing circuitry need not be tailored to address a specific wavelength or band of wavelengths.

Figure 13:
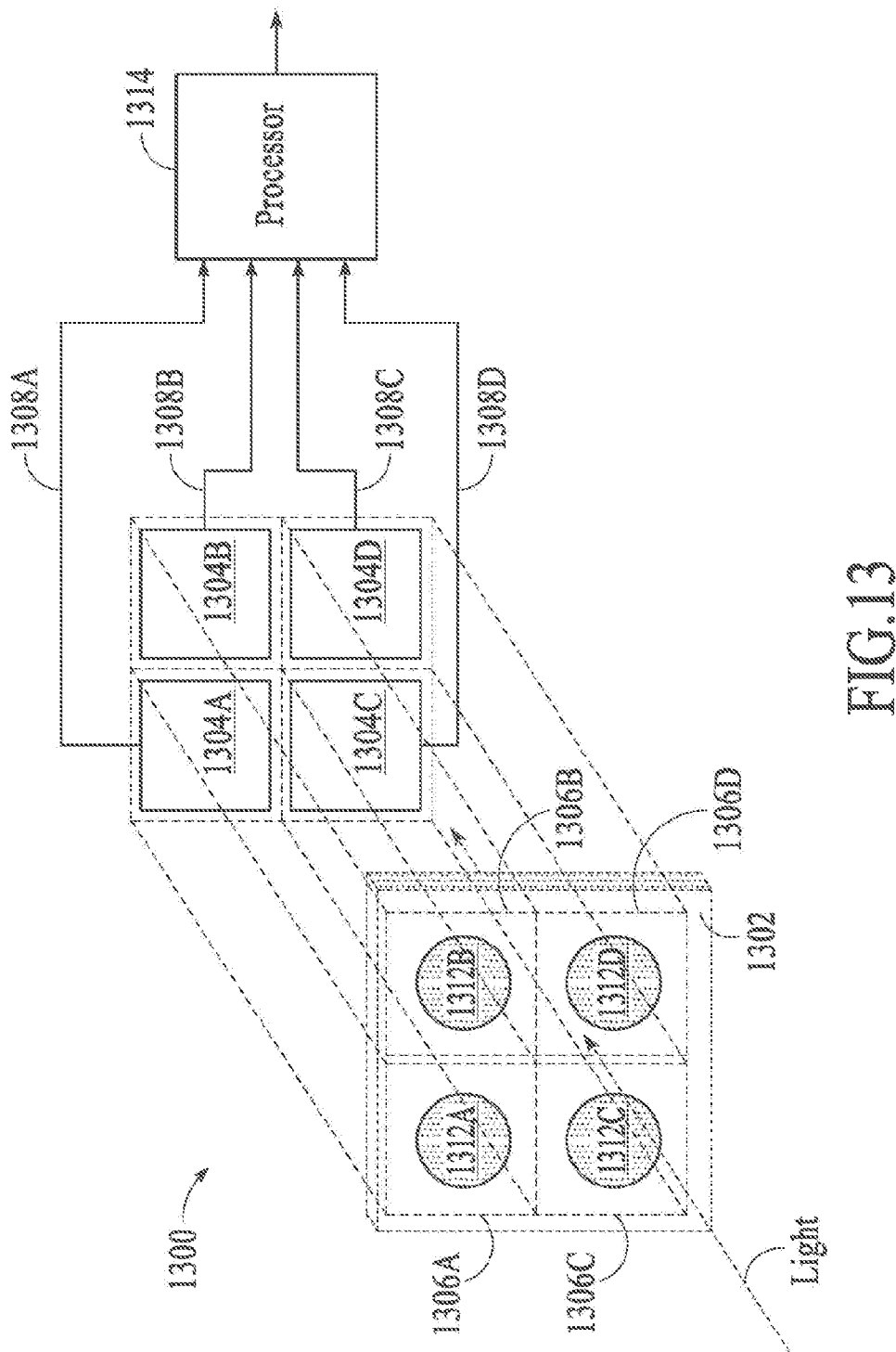
FIG. 13 is an exploded perspective view of a digital camera, under an embodiment.

FIG. 13 is an exploded perspective view of a digital camera 1300, under an embodiment. The digital camera apparatus 1300 includes one or more sensor arrays, e.g., four sensor arrays 1304A-1304D, and one or more optics portions, e.g., four optics portions 1312A-1312D. Each of the optics portions 1304A-1304D may include a lens, and may be associated with a respective one of the sensor arrays sensor arrays 1304A-1304D. In some embodiments a support 1302, for example a frame, is provided to support the one or more optics portions 1312A-1312D, at least in part. Each sensor array and the respective optics portion may define an optical channel. For example, an optical channel 1306A may be defined by the optics portion 1312A and the sensor array 1304A. An optical channel 1306B may be defined by the optics portion 1312B and the sensor array 1304B. An optical channel 1306C may be defined by optics portion 1312C and the sensor array 1304C. An optical channel 1306D may be defined by optics portion 1312D and a sensor array 1304D. The optics portions of the one or more optical channels are also collectively referred to as an optics subsystem.

The sensor arrays of the one or more optical channels are collectively referred as a sensor subsystem. The two or more sensor arrays may be integrated in or disposed on a common substrate, referred to as an image device, on separate substrates, or any combination thereof For example, where the system includes three or more sensor arrays, two or more sensor arrays may be integrated in a first substrate, and one or more other sensor arrays may be integrated in or disposed on a second substrate.

In that regard, the one or more sensor arrays 1304A-1304D, may or may not be disposed on a common substrate. For example, in some embodiments two or more of the sensor arrays are disposed on a common substrate. In some embodiments, however, one or more of the sensor arrays is not disposed on the same substrate as one or more of the other sensor arrays. The one or more optical channels may or may not be identical to one another.

In some embodiments, one of the optical channels 1306 detects red light, one of the optical channels 1306 detects green light, and one of the optical channels 1306 detects blue light. In some of such embodiments, one of the optical channels 1306 detects infrared light, cyan light, or emerald light. In some other embodiments, one of the optical channels 1306 detects cyan light, one of the optical channels 1306 detects yellow light, one of the optical channels 1306 detects magenta light and one of the optical channels 1306 detects clear light (black and white). Any other wavelength or band of wavelengths (whether visible or invisible) combinations can also be used.

A processor 1314 is coupled to the one or more sensor arrays 1304A-1304D, via one or more communication links, e.g., communication links 1308A-1308D, respectively. A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may include for example circuit switching or packet switching or combinations thereof Other examples of communication links include dedicated point-to-point systems, wired networks, and cellular telephone systems. A communication link may employ any protocol or combination of protocols including but not limited to the Internet Protocol.

The communication link may transmit any type of information. The information may have any form, including, for example, but not limited to, analog and/or digital) e.g., a sequence of binary values, or a bit string). The information may or may not be divided into blocks. If divided into blocks, the amount of information in a block may be predetermined or determined dynamically, and/or may be fixed (e.g., uniform) or variable.

As will be further described hereinafter, the processor may include one or more channel processors, each of which is coupled to a respective one (or more) of the optical channels and generates an image based at least in part on the signal(s) received from the respective optical channel, although this is not required. In some embodiments, one or more of the channel processors is tailored to its respective optical channel, for example, as described herein. For example, when one of the optical channels is dedicated to a specific wavelength or color (or band of wavelengths or colors) the respective channel processor may be adapted or tailored to such wavelength or color (or band of wavelengths or colors). Further, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective optical channel may facilitate generating an image of a quality that is higher than the quality of images resulting from traditional image sensors of like pixel count. In addition, providing each optical channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

In operation, an optics portion of a optical channel receives light from within a field of view and transmits one or more portions of such light, e.g., in the form of an image at an image plane. The sensor array receives one or more portions of the light transmitted by the optics portion and provides one or more output signals indicative thereof The one or more output signals from the sensor array are supplied to the processor. In some embodiments, the processor generates one or more output signals based, at least in part, on the one or more signals from the sensor array. In some other embodiments, the processor may generate a combined image based, at least in part, on the images from two or more of such optical channels.

Although the processor 1314 is shown separate from the one or more sensor arrays 1304A-1304D, the processor 1314, or portions thereof, may have any configuration and may be disposed in one or more locations. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

The digital camera apparatus 1300 may or may not include a shutter, a flash and/or a frame to hold the components together.

FIGS. 14A-14D are schematic exploded representations of one embodiment of an optics portion, such as optic portion 1312A, under an embodiment. In FIG. 14A, the optics portion 1312A includes one or more lenses, e.g., a complex lens module 1480, one or more color coatings, e.g., a color coating 1482, one or more masks, e.g., an auto focus mask 1484, and one or more IR coatings, e.g., an IR coating 1486.

Lenses can comprise any suitable material or materials, including for example, glass and plastic. Lenses can be doped (dyed) or manufactured in any suitable manner, such as to impart a color filtering, polarization, or other property. Lenses can be rigid or flexible. In this regard, some embodiments employ a lens (or lenses) having a dye coating, a dye diffused in an optical medium (e.g., a lens or lenses), a substantially uniform color filter and/or any other filtering technique through which light passes to the underlying array.

The color coating 1482 helps the optics portion filter (or substantially attenuate) one or more wavelengths or bands of wavelengths. The auto focus layer 1484 may define one or more interference patterns that help the digital camera apparatus perform one or more auto focus functions. The IR coating 1486 helps the optics portion 1312A filter a wavelength or band of wavelength in the IR portion of the spectrum.

The one or more color coatings, e.g., color coating 1482, one or more masks, e.g., mask 1484, and one or more IR coatings, e.g., IR coating 1486 may have any size, shape and/or configuration.

In some embodiments, as shown in FIG. 14B, one or more of the one or more color coatings, e.g., the color coating 1482, are disposed at the top of the optics portion. Some embodiments of the optics portion (and/or components thereof) may or may not include the one or more color coatings, one or more masks and one or more IR coatings and may or may not include features in addition thereto or in place thereof In some embodiments, as shown in FIG. 14C, one or more of the one or more color coatings, e.g., the color coating 1482, are replaced by one or more filters 1488 disposed in the optics portion, e.g., disposed below the lens. In other embodiments, as shown in FIG. 14D, one or more of the color coatings are replaced by one or more dyes diffused in the lens.

The one or more optics portions, e.g., optics portions 1312A-1312D, may or may not be identical to one another. In some embodiments, for example, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, response, and/or performance) of one or more of the optics portions is tailored to the respective sensor array and/or to help achieve a desired result. For example, if a particular optical channel is dedicated to a particular color (or band of colors) or wavelength (or band of wavelengths) then the optics portion for that optical channel may be adapted to transmit only that particular color (or band of colors) or wavelength (or band of wavelengths) to the sensor array of the particular optical channel and/or to filter out one or more other colors or wavelengths. In some of such embodiments, the design of an optical portion is optimized for the respective wavelength or bands of wavelengths to which the respective optical channel is dedicated. It should be understood, however, that any other configurations may also be employed. Each of the one or more optics portions may have any configuration.

In some embodiments, each of the optics portions, e.g., optics portions 1312A-1312D of FIG. 13, comprises a single lens element or a stack of lens elements (or lenslets), although, as stated above. For example, in some embodiments, a single lens element, multiple lens elements and/or compound lenses, with or without one or more filters, prisms and/or masks are employed.

An optical portion can also contain other optical features that are desired for digital camera functionality and/or performance. For example, these features can include electronically tunable filters, polarizers, wavefront coding, spatial filters (masks), and other features not yet anticipated. Some of the features (in addition to the lenses) are electrically operated (such as a tunable filter), or are mechanically movable with MEMs mechanisms.

In some embodiments, one or more photochromic (or photochromatic) materials are employed in one or more of the optical portions. The one or more materials may be incorporated into an optical lens element or as another feature in the optical path, for example, above one or more of the sensor arrays. In some embodiments, photochromatic materials may be incorporated into a cover glass at the camera entrance (common aperture) to all optics (common to all optical channels), or put into the lenses of one or more optical channels, or into one or more of the other optical features included into the optical path of an optics portion over any sensor array.

FIGS. 15A-15C are schematic representations of one embodiment of a sensor array 1504. The sensor array is similar to one of the sensor arrays 1304A-1304D of FIG. 13, for example. As shown in FIG. 15A, the sensor array 1504 is coupled to circuits 1570, 1572, and 1574. The sensor array sensor array 1504 captures light and converts it into one or more signals, such as electrical signals, which are supplied to one or more of the circuits 1570, 1572, and 1574. The sensor array 1504 includes a plurality of sensor elements such as for example, a plurality of identical photo detectors (sometimes referred to as "picture elements" or "pixels"), e.g., pixels $\mathbf{1580}_{1,1}\text{-}\mathbf{1580}_{n,m}$. The photo detectors $\mathbf{1580}_{1,1}\text{-}\mathbf{1580}_{n,m}$, are arranged in an array, for example a matrix-type array. The number of pixels in the array may be, for example, in a range from hundreds of thousands to millions. The pixels may be arranged for example, in a two-dimensional array configuration, for example, having a plurality of rows and a plurality of columns, e.g., 640×480, 1280×1024, etc. However, the pixels can be sized and dimensioned as desired, and can be distributed in any desired pattern. Pixels that are distributed without any regular pattern can also used. Referring to FIG. 15B, a pixel, for example pixel $\mathbf{1580}_{1,1}$, may be viewed as having x and y dimensions, although the photon capturing portion of a pixel may or may not occupy the entire area of the pixel and may or may not have a regular shape. In some embodiments, the sensor elements are disposed in a plane, referred to herein as a sensor plane. The sensor may have orthogonal sensor reference axes, including for example, an x-axis, a y-axis, and a z-axis, and may be configured so as to have the sensor plane parallel to the x-y plane XY and directed toward the optics portion of the optical channel. Each optical channel has a field of view corresponding to an expanse viewable by the sensor array. Each of the sensor elements may be associated with a respective portion of the field of view.

The sensor array may employ any type of technology, for example, but not limited to MOS pixel technologies (e.g., one or more portions of the sensor are implemented in "Metal Oxide Semiconductor" technology), charge coupled device (CCD) pixel technologies, or combination of both. The sensor array may comprise any suitable material or materials, including, but not limited to, silicon, germanium and/or combinations thereof. The sensor elements or pixels may be formed in any suitable manner.

In operation, the sensor array 1504A, is exposed to light on a sequential line per line basis (similar to a scanner, for example) or globally (similar to conventional film camera exposure, for example). After being exposed to light for certain period of time (exposure time), the pixels $1580_{1,1}$-$1580_{n,m}$, are read out, e.g., on a sequential line per line basis.

In some embodiments, circuitry 1570, also referred to as column logic 1570, is used to read the signals from the pixels $1580_{1,1}$-$1580_{n,m}$. FIG. 15C is a schematic representation of a pixel circuit. The pixels $1580_{1,1}$-$1580_{n,m}$, also referred to as sensor elements, may be accessed one row at a time by asserting one of the word lines 1582, which run horizontally through the sensor array 1504A. A single pixel $1580_{1,1}$ is shown. Data is passed into and/or out of the pixel $1580_{1,1}$ via bit lines (such as bit line 1584) which run vertically through the sensor array 1504A.

The pixels are not limited to the configurations shown in FIGS. 15A-15C. As stated above, each of the one or more sensor arrays may have any configuration (e.g., size, shape, pixel design, and pixel electronic circuitry).

The sensor arrays 1302A-1302D of FIG. 13 may or may not be identical to one another. In some embodiments, for example, the sensor arrays are identical to one another. In some other embodiments, one or more of the sensor arrays are different, in one or more respects, from one or more of the other sensor arrays. For example, in some embodiments, one or more of the characteristics (for example, but not limited to, its type of element(s), size (for example, surface area), and/or performance) of one or more of the sensor arrays is tailored to the respective optics portion and/or to help achieve a desired result.

Figure 16:
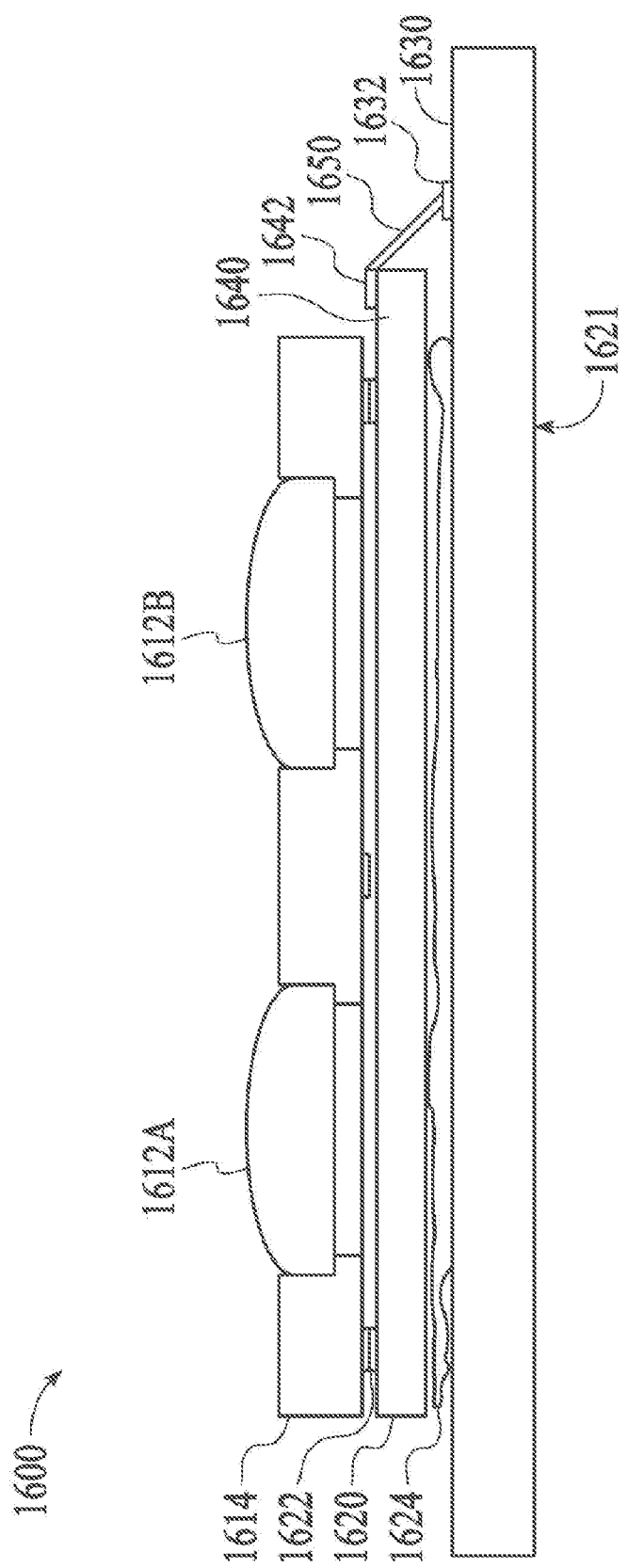
FIG. 16 is a schematic cross-sectional view of a digital camera apparatus, under an embodiment.

FIG. 16 is a schematic cross-sectional view of a digital camera apparatus 1600 including a printed circuit board 1620 of a digital camera on which the digital camera elements are mounted, under an embodiment. In this embodiment, the one or more optics portions, e.g., optics portions 1612A and 1612B are seated in and/or affixed to a support 1614. The support 1614 (for example a frame) is disposed superjacent a first bond layer 1622, which is disposed superjacent an image device 1620, in or on which sensor portions 1612A-1612D (sensor portions 1612C and 1612D are not shown), are disposed and/or integrated. The image device 1620 is disposed superjacent a second bond layer 1624 which is disposed superjacent the printed circuit board 1621.

The printed circuit board 1621 includes a major outer surface 1630 that defines a mounting region on which the image device 1620 is mounted. The major outer surface 1630 may further define and one or more additional mounting regions (not shown) on which one or more additional devices used in the digital camera may be mounted. One or more pads 1632 are provided on the major outer surface 1630 of the printed circuit board to connect to one or more of the devices mounted thereon.

The image device 1620 includes the one or more sensor arrays (not shown), and one or more electrically conductive layers. In some embodiments, the image device 1620 further includes one, some or all portions of a processor for the digital camera apparatus 1600. The image device 1620 further includes a major outer surface 1640 that defines a mounting region on which the support 1614 is mounted.

The one or more electrically conductive layers may be patterned to define one or more pads 1642 and one or more traces (not shown) that connect the one or more pads to one or more of the one or more sensor arrays. The pads 1642 are disposed, for example, in the vicinity of the perimeter of the image device 1620, for example along one, two, three or four sides of the image device 1620. The one or more conductive layers may comprise, for example, copper, aluminum, and/or any other suitably conductive material(s).

A plurality of electrical conductors 1650 may connect one or more of the pads 1642 on the image device 1620 to one or more of the pads 1632 on the circuit board 1621. The conductors 1650 may be used, for example, to connect one or more circuits on the image device 1620 to one or more circuits on the printed circuit board 1621.

The first and second bond layers 1622 and 1624 may comprise any suitable material(s), including but not limited to adhesive, and may comprise any suitable configuration. The first and second bond layers 1622, 1624 may comprise the same material(s) although this is not required. As used herein, a bond layer may be continuous or discontinuous. For example, a conductive layer may be an etched printed circuit layer. Moreover, a bond layer may or may not be planar or even substantially planar. For example, a conformal bond layer on a non-planar surface will be non-planar. While a wire bonded attachment is shown in FIG. 16, electrical vias can be made through image device 120 to provide a bump interconnect to pads 1632 on circuit board 1621.

Figure 17:
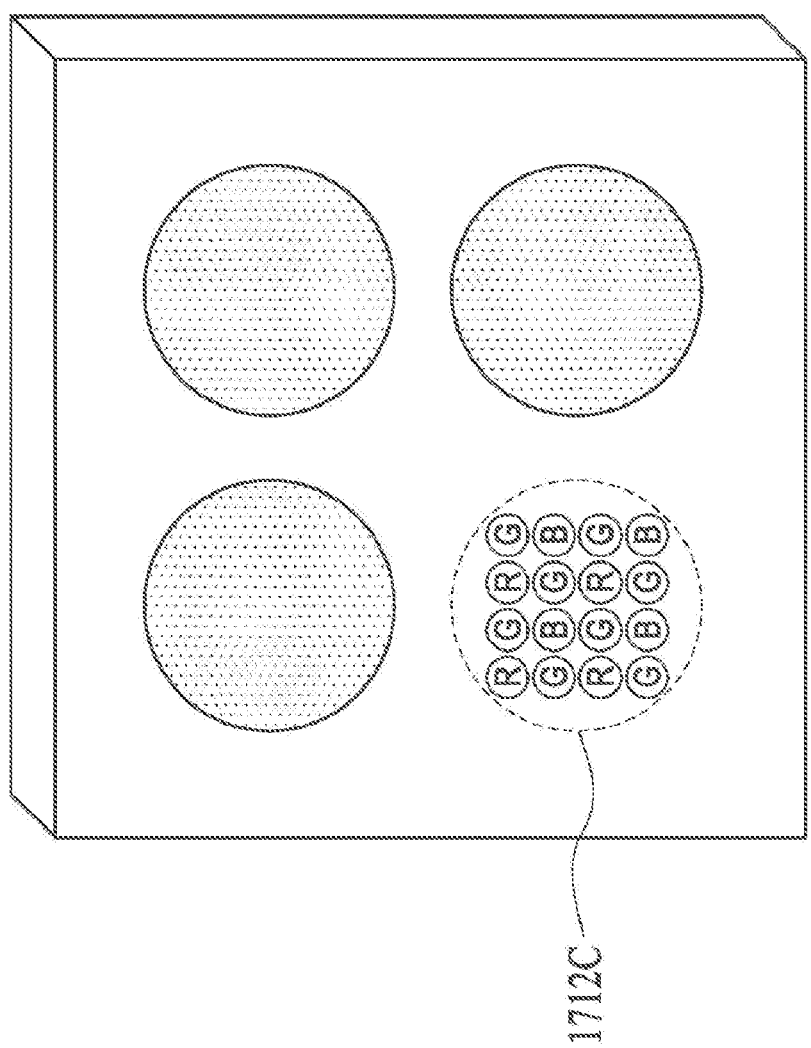
FIG. 17 is a schematic perspective view of a digital camera apparatus having one or more optics portions with the capability to provide color separation, under an embodiment.

FIG. 17 is a schematic perspective view of a digital camera apparatus having one or more optics portions with the capability to provide color separation in accordance with one embodiment of the present disclosure. In some of such embodiments, one or more of the optics portions, e.g., optics portion 1712C includes an array of color filters (e.g., Bayer pattern, Bayer pattern on the imaging array beneath the optics portion, a color filter on the imaging array and separate from the lens assembly). In some of such embodiments, one or more of the optics portions, e.g., optics portion 1712C has the capability to provide color separation similar to that which is provided by a color filter array.

In some embodiments, the lens and/or filter of the optical channel may transmit both of such colors or bands of colors, and the optical channel may include one or more mechanisms elsewhere in the optical channel to separate the two colors or two bands of colors. For example, a color filter array may be disposed between the lens and the sensor array, and/or the optical channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures and/or characteristics that make them selective, such that the first photodiode has a higher sensitivity to the first color or first band of colors than to the second color or band of colors, and the second photodiode has a higher sensitivity to the second color or second band of colors than to the first color or first band of colors. Alternatively, the photodiodes are disposed at different depths in the pixel, taking advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed, even though the pixels may see only one particular color or band of colors, for example, to in order to adapt such sensor array to the particular color or band of colors.

Figure 18A:
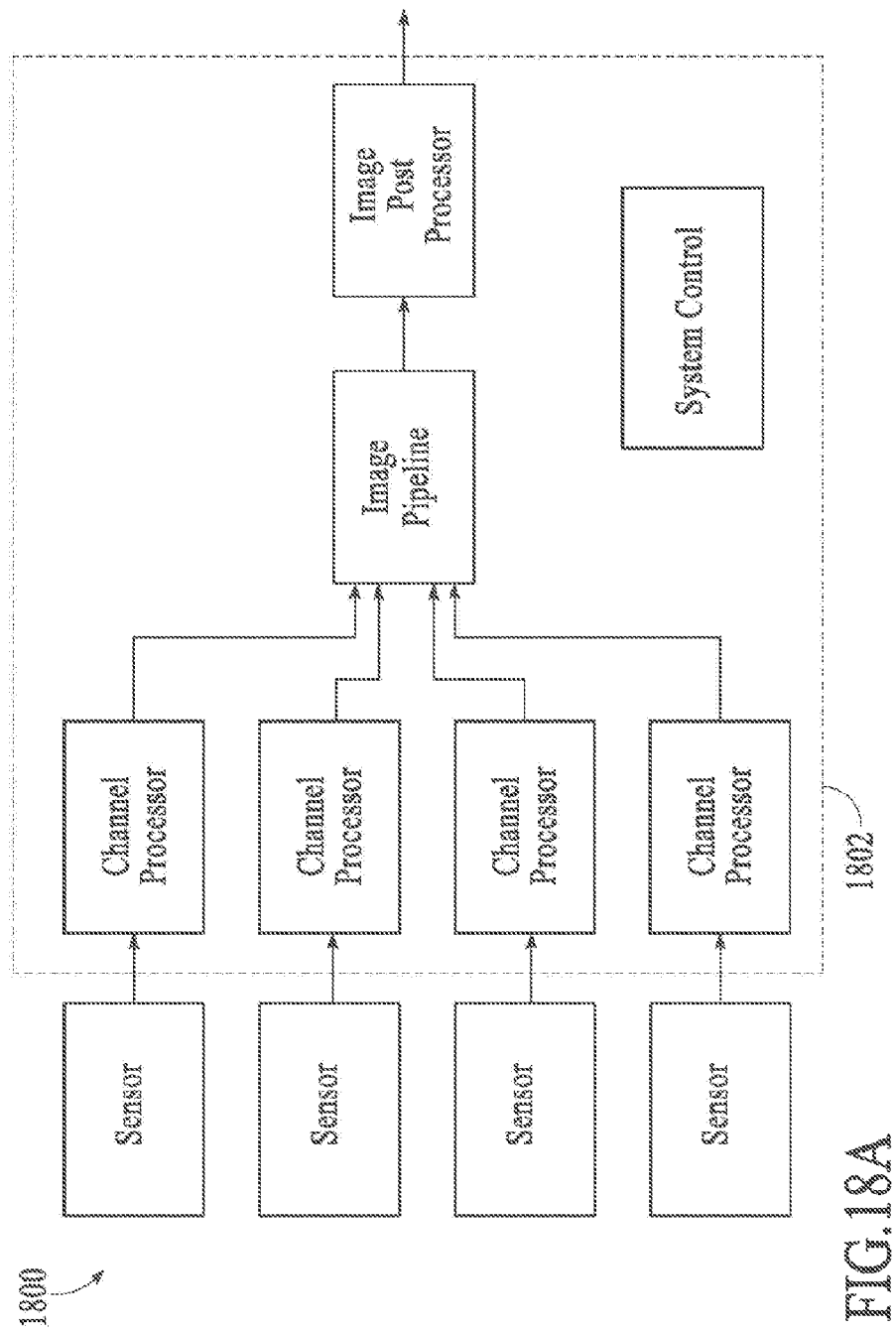
FIG. 18A is a block diagram of a processor of a digital camera subsystem, under an embodiment.

FIG. 18A is a block diagram of a processor 1802 of a digital camera subsystem 1800, under an embodiment. In this embodiment, the processor 1802 includes one or more channel processors, one or more image pipelines, and/or one or more image post processors. Each of the channel processors is coupled to a respective one of the optical channels (not shown) and generates an image based at least in part on the signal(s) received from the respective optical channel. In some embodiments the processor 1802 generates a combined imaged based at least in part on the images from two or more of the optical channels. In some embodiments, one or more of the channel processors are tailored to its respective optical channel, as previously described.

In various embodiments, the gain, noise reduction, dynamic range, linearity and/or any other characteristic of the processor, or combinations of such characteristics, may be adapted to improve and/or optimize the processor to a wavelength or color (or band of wavelengths or colors). Tailoring the channel processing to the respective optical channel makes it possible to generate an image of a quality that is higher than the quality of images resulting from traditional image sensors of like pixel count. In such embodiments, providing each optical channel with a dedicated channel processor helps to reduce or simplify the amount of logic in the channel processors, as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme The images (and/or data which is representative thereof) generated by the channel processors are supplied to the image pipeline, which may combine the images to form a full color or black/white image. The output of the image pipeline is supplied to the post processor, which generates output data in accordance with one or more output formats.

Figure 18B:
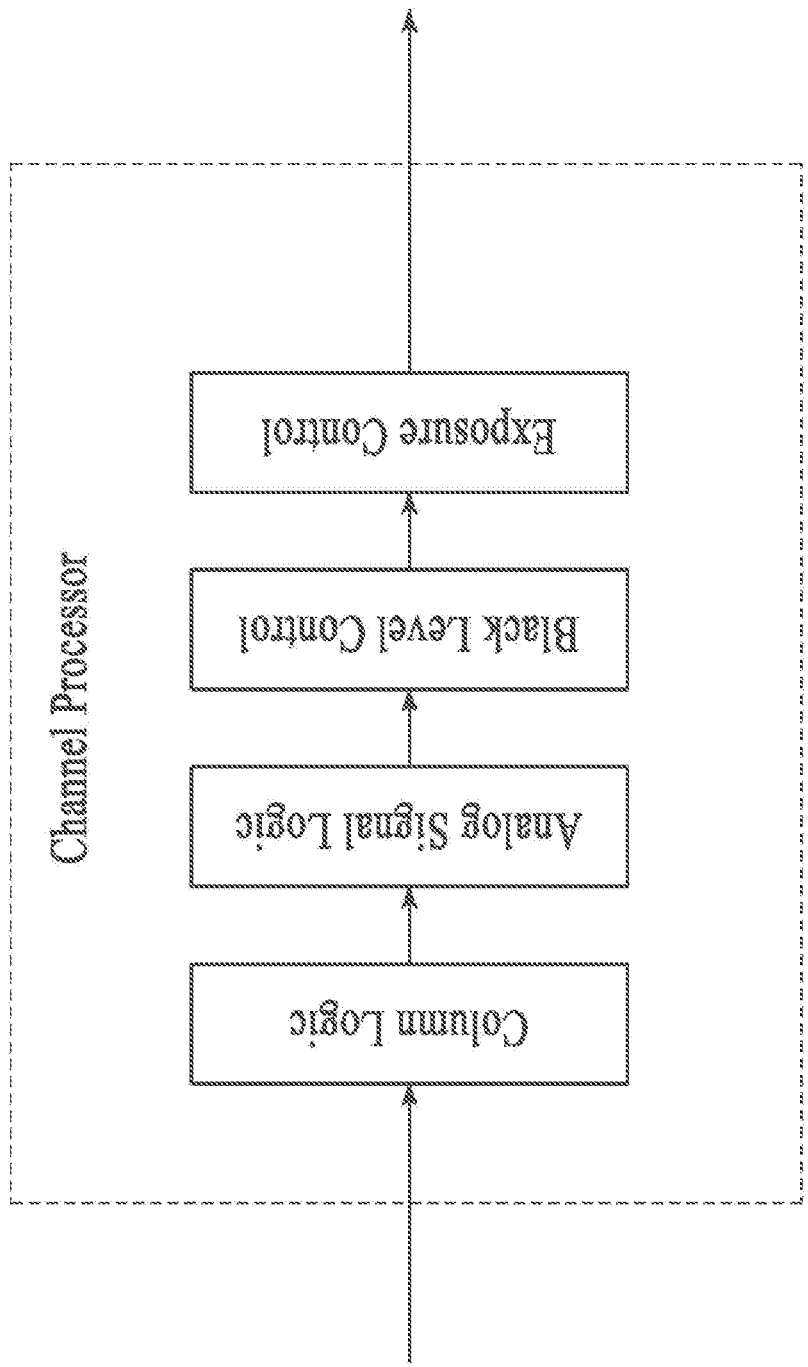
FIG. 18B is a block diagram of a channel processor of a digital camera subsystem, under an embodiment.

FIG. 18B shows one embodiment of a channel processor. In this embodiment, the channel processor includes column logic, analog signal logic, and black level control and exposure control. The column logic is coupled to the sensor and reads the signals from the pixels. Each of the column logic, analog signal logic, digital signal logic, black level control and exposure control can be configured for processing as appropriate to the corresponding optical channel configuration (e.g., specific wavelength or color, etc.). For example, the analog signal logic is optimized, if desired, for processing. Therefore, gain, noise, dynamic range and/or linearity, etc., are optimized as appropriate to the corresponding optical channel configuration (e.g., a specific wavelength or color, etc.). As another example, the column logic may employ an integration time or integration times adapted to provide a particular dynamic range as appropriate to the corresponding optical channel.

The digital camera systems of an embodiment provide digital cameras with large effective single-frame dynamic exposure ranges through the use of multiple camera channels, including multiple optics and image sensors. The multiple camera channels are all configured to image the same field of view simultaneously, and each operates independently under a different integration time. The digital camera can include, for example, a 3×3 assembly of image sensors, perhaps three sensor of each color (e.g., red (R), green (G), and blue (B)) and the integration time of the sensors associated with each color can be varied, for example, each color can have three distinct values (e.g., 0.1 msec, 1 msec, and 10 msec integration time, respectively). The data from all sensors can be digitally combined to provide a much greater dynamic range within one frame of digital camera data. The raw digital camera data could be used by digital signal processing of the scene. The digital data can also be stored and displayed to exhibit low light or bright light characteristics as desired.

Exposure is the total amount of light allowed to fall on a sensor during the process of taking a photograph. Exposure control is control of the total amount of light incident on a sensor during the process of taking a photograph.

In contrast to exposure control, which is used by conventional digital cameras to manage dynamic range, the digital camera systems of an embodiment use integration time control to control the time the electrical signal is integrated on a charge storage device (capacitance) within a sensor (pixel), as described herein. Integration time control, also referred to as "focal plane shutter" control, controls the time the electrical signal is integrated or accumulated by controlling a switch (e.g., charge integration switch) coupled or connected to the sensor or a photo-detection mechanism of a sensor. For example, the charge integration switch is placed in a state to allow charge to accumulate within the sensor for a period of time approximately equal to the integration time corresponding to that sensor; upon completion of the integration period, the switch is placed in a state to transfer the accumulated charge as a photo-signal to a processing component. Digital camera components or circuitry are configured to allow independent control of the charge integration switch associated with each sensor, thereby making possible dynamic range control for each sensor. The integration time control can be executed (depending on readout configuration) according to a number of techniques, for example, rolling mode and/or snap-shot mode to name a few.

The output of the analog signal logic is supplied to the black level control, which determines the level of noise within the signal, and filters out some or all of such noise. If the sensor coupled to the channel processor is focused upon a narrower band of visible spectrum than traditional image sensors, the black level control can be more finely tuned to eliminate noise.

The output of the black level control is supplied to the exposure control, which measures the overall volume of light being captured by the array and adjusts the capture time for image quality. Traditional cameras must make this determination on a global basis (for all colors). In the camera of an embodiment, however, the exposure control can be specifically adapted to the wavelength (or band of wavelengths) to which the sensor is configured. Each channel processor is thus able to provide a capture time that is specifically adapted to the sensor and/or specific color (or band of colors) targeted, and which may be different than the capture time provided by another channel processor for another optical channel.

Figure 18C:
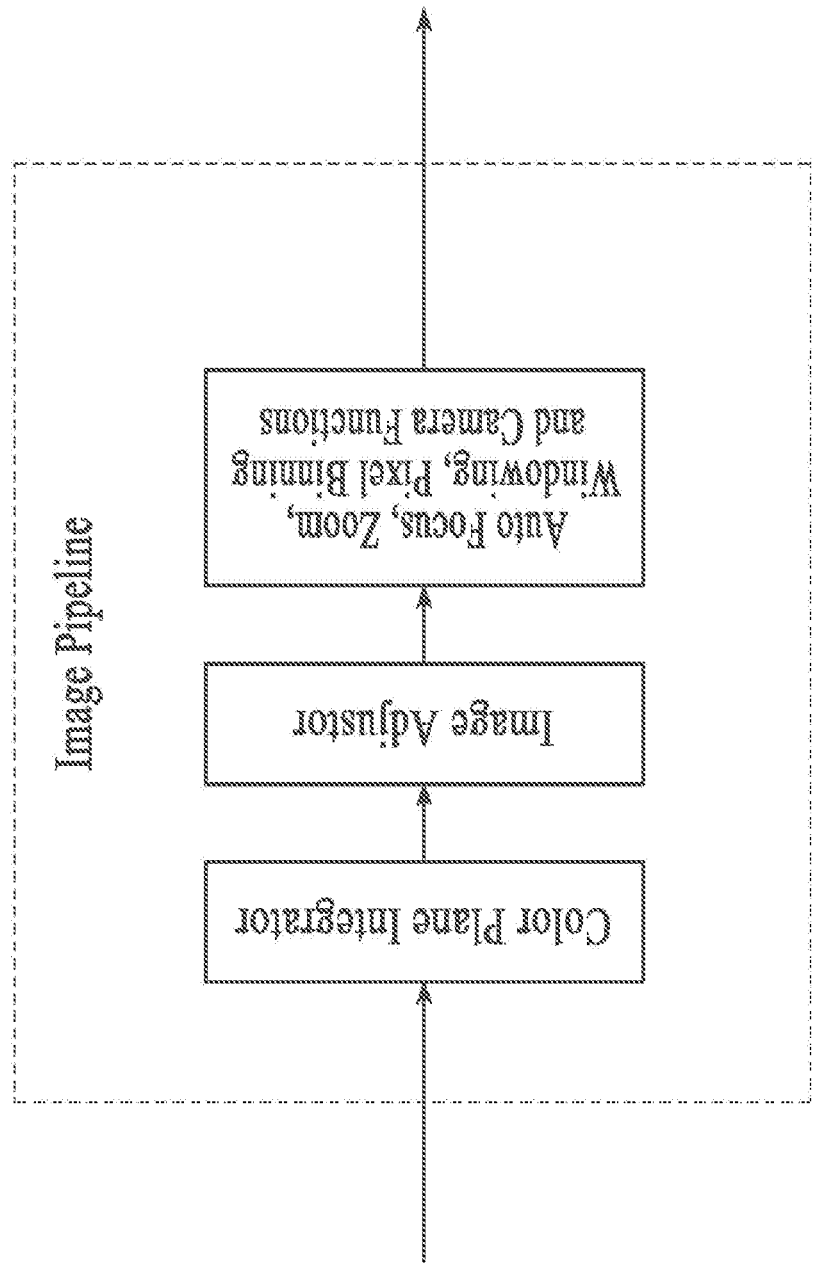
FIG. 18C is a block diagram of an image pipeline of a digital camera subsystem, under an embodiment.

FIG. 18C is a block diagram of the image pipeline, under an embodiment. In this embodiment, the image pipeline includes two portions. The first portion includes a color plane integrator and an image adjustor. The color plane integrator receives an output from each of the channel processors and integrates the multiple color planes into a single color image. The output of the color plane integrator, which is indicative of the single color image, is supplied to the image adjustor, which adjusts the single color image for saturation, sharpness, intensity and hue. The adjustor also adjusts the image to remove artifacts and any undesired effects related to bad pixels in the one or more color channels. The output of the image adjustor is supplied to the second portion of the pipeline, which provides auto focus, zoom, windowing, pixel binning and camera functions.

Figure 18D:
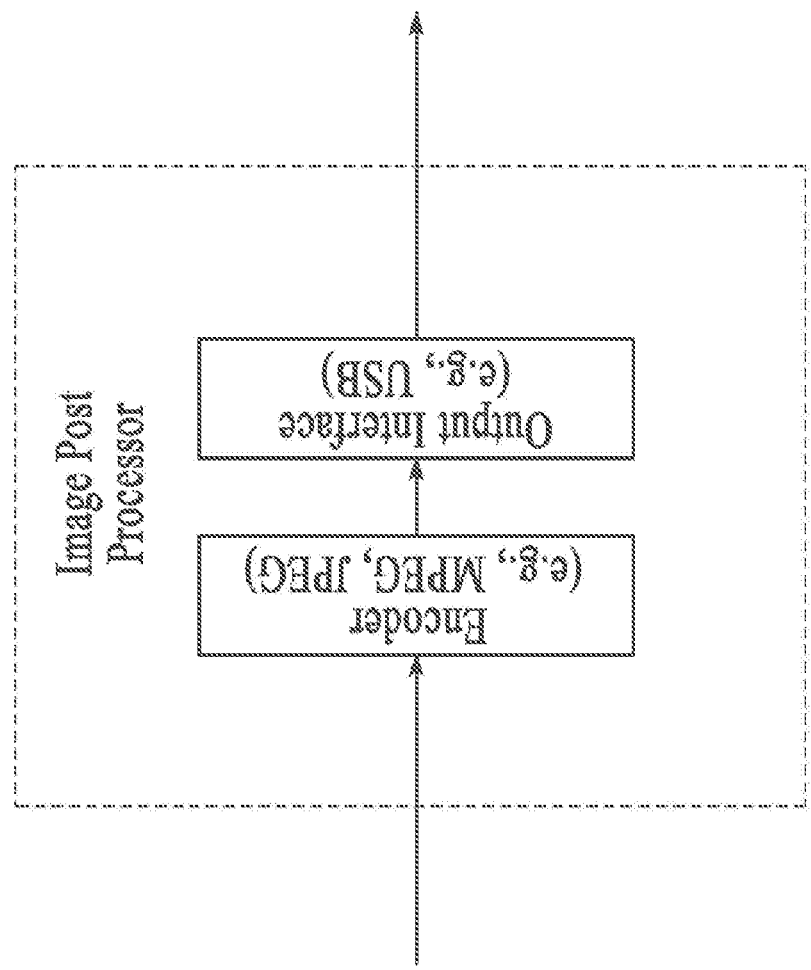
FIG. 18D is a block diagram of an image post processor of a digital camera subsystem, under an embodiment.

FIG. 18D is a block diagram of the image post processor, under an embodiment. In this embodiment, the image post processor includes an encoder and an output interface. The encoder receives the output signal from the image pipeline and provides encoding to supply an output signal in accordance with one or more standard protocols (e.g., MPEG and/or JPEG). The output of the encoder is supplied to the output interface, which provides encoding to supply an output signal in accordance with a standard output interface, e.g., universal serial bus (USB) interface.

Figure 19:
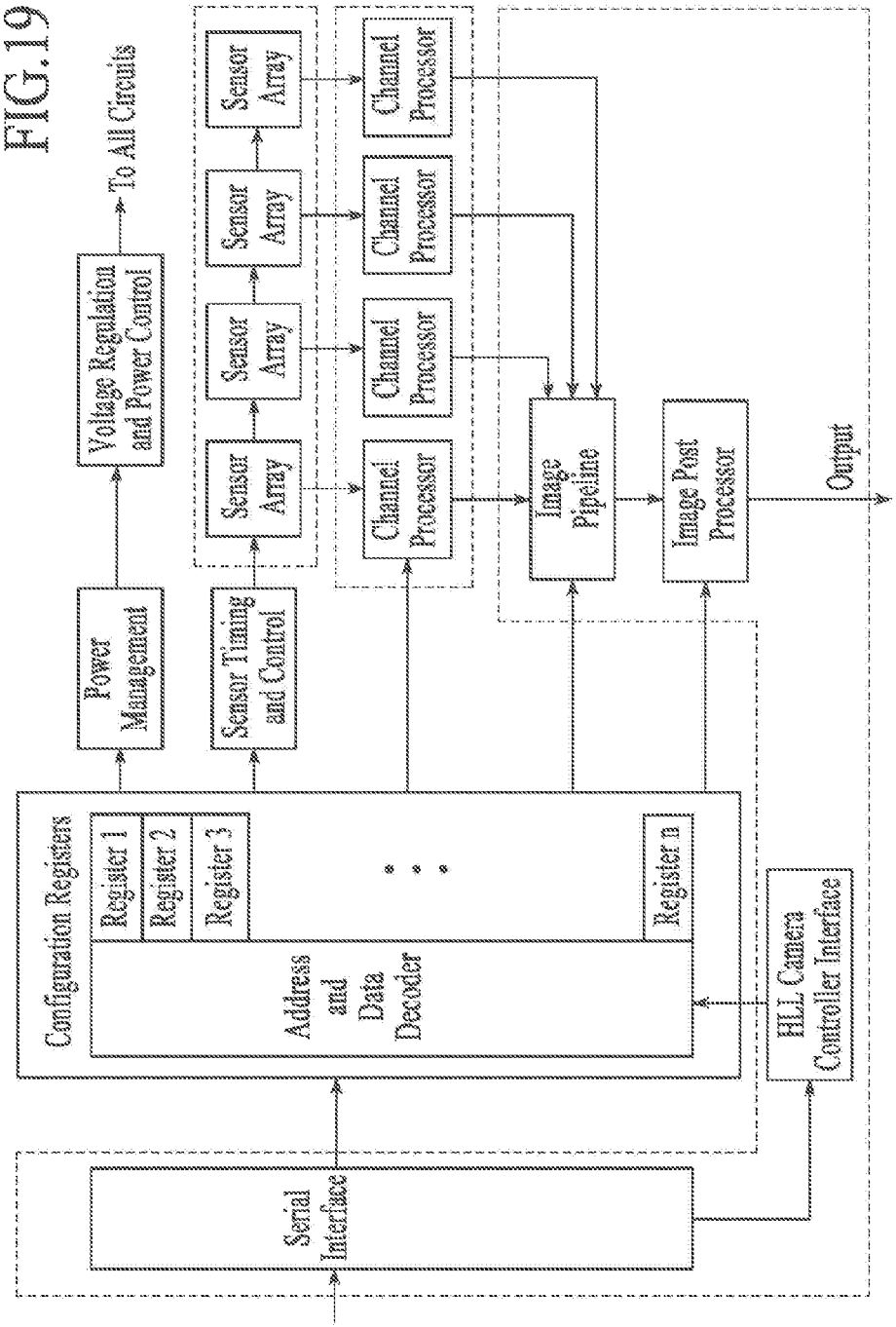
FIG. 19 is a block diagram of digital camera system, including system control components, under an embodiment.

FIG. 19 is a block diagram of digital camera system, including system control components, under an embodiment. The system control portion includes a serial interface, configuration registers, power management, voltage regulation and control, timing and control, a camera control interface and a serial interface, but is not so limited. In some embodiments, the camera interface comprises an interface that processes signals that are in the form of high level language (HLL) instructions. In some embodiments the camera interface comprises an interface that processes control signals that are in the form of low level language (LLL) instructions and/or of any other form now known or later developed. Some embodiments may process both HLL instructions and LLL instructions.

As used herein, the following terms are interpreted as described below, unless the context requires a different interpretation.

"Array" means a group of photodetectors, also know as pixels, which operate in concert to create one image. The array captures photons and converts the data to an electronic signal. The array outputs this raw data to signal processing circuitry that generates the image sensor image output.

"Digital Camera" means a single assembly that receives photons, converts them to electrical signals on a semiconductor device ("image sensor"), and processes those signals into an output that yields a photographic image. The digital camera would included any necessary lenses, image sensor, shutter, flash, signal processing circuitry, memory device, user interface features, power supply and any mechanical structure (e.g. circuit board, housing, etc) to house these components. A digital camera may be a stand-alone product or may be imbedded in other appliances, such as cell phones, computers or the myriad of other imaging platforms now available or to be created in the future, such as those that become feasible as a result of this disclosure.

"Digital Camera Subsystem" (DCS) means a single assembly that receives photons, converts them to electrical signals on a semiconductor device ("image sensor") and processes those signals into an output that yields a photographic image. The Digital Camera Subsystem includes any necessary lenses, image sensor, signal processing circuitry, shutter, flash and any frame to hold the components as may be required. The power supply, memory devices and any mechanical structure are not necessarily included.

"Electronic media" means that images are captured, processed and stored electronically as opposed to the use of film.

"Frame" or "thin plate" means the component of the DCS that is used to hold the lenses and mount to the image sensor.

"Image sensor" means the semiconductor device that includes the photon detectors ("pixels"), processing circuitry and output channels. The inputs are the photons and the output is the image data.

"Lens" means a single lens or series of stacked lenses (a column one above the other) that shape light rays above an individual array. When multiple stacks of lenses are employed over different arrays, they are called "lenses."

"Package" means a case or frame that an image sensor (or any semiconductor chip) is mounted in or on, which protects the imager and provides a hermetic seal. "Packageless" refers to those semiconductor chips that can be mounted directly to a circuit board without need of a package.

The terms "Photo-detector" and "pixels" mean an electronic device that senses and captures photons and converts them to electronic signals. These extremely small devices are used in large quantities (hundreds of thousands to millions) in a matrix to capture an image.

"Semiconductor Chip" means a discrete electronic device fabricated on a silicon or similar substrate, which is commonly used in virtually all electronic equipment.

"Signal Processing Circuitry" means the hardware and software within the image sensor that translates the photon input information into electronic signals and ultimately into an image output signal.

Aspects of the digital camera systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the digital camera systems include: microcontrollers with memory (such as electronically erasable programmable read only memory (EEPROM)), embedded microprocessors, firmware, software, etc. Furthermore, aspects of the digital camera systems may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

The functions described herein can be performed by programs or sets of program codes, including software, firmware, executable code or instructions running on or otherwise being executed by one or more general-purpose computers or processor-based systems. The computers or other processor-based systems may include one or more central processing units for executing program code, volatile memory, such as RAM for temporarily storing data and data structures during program execution, non-volatile memory, such as a hard disc drive or optical drive, for storing programs and data, including databases and other data stores, and a network interface for accessing an intranet and/or the Internet. However, the digital camera systems and methods may also be implemented using special purpose computers, wireless computers, state machines, and/or hardwired electronic circuits.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described components may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the digital camera systems and methods is not intended to be exhaustive or to limit the digital camera systems and methods to the precise form disclosed. While specific embodiments of, and examples for, the digital camera systems and methods are described herein for illustrative purposes, various equivalent modifications are possible within the scope of the digital camera systems and methods, as those skilled in the relevant art will recognize. The teachings of the digital camera systems and methods provided herein can be applied to other systems and methods, not only for the systems and methods described above.

The elements and acts of the various embodiments described above can be combined to provide further embodiments. These and other changes can be made to the digital camera systems and methods in light of the above detailed description.

In general, in the following claims, the terms used should not be construed to limit the digital camera systems and methods to the specific embodiments disclosed in the specification and the claims, but should be construed to include all systems that operate under the claims. Accordingly, the digital camera systems and methods are not limited by the disclosure, but instead the scope of the digital camera systems and methods is to be determined entirely by the claims.

While certain aspects of the digital camera systems and methods are presented below in certain claim forms, the inventors contemplate the various aspects of the digital camera systems and methods in any number of claim forms. Accordingly, the inventors reserve the right to add additional claims after filing the application to pursue such additional claim forms for other aspects of the digital camera systems and methods.

What is claimed is:

1. A digital camera comprising:
   a first channel including a first optics component and a first image sensor, wherein the first channel is configured to output luminance data;
   a second channel including a second optics component and a second image sensor, wherein the second channel is configured to generate chroma data, wherein the chroma data is generated through combination of color band data with the luminance data; and
   a processing component coupled to the first and second channels and configured to combine outputs of the first and second channels to generate an image.

2. The digital camera of claim 1, wherein the second channel is further configured to generate blue chroma data through combination of blue color band data with the luminance data.

3. The digital camera of claim 2, wherein the second channel is further configured to output chrominance data, wherein the chrominance data is based on at least one of the chroma data and the blue chroma data.

4. The digital camera of claim 2, wherein the second channel is configured to image a red color band to obtain the color band data.

5. The digital camera of claim 2, wherein the second channel is configured to image a blue color band to obtain the blue color band data.

6. The digital camera of claim 2, wherein the red chroma data and the blue chroma data are generated without interpolation of red-green-blue (RGB) data.

7. The digital camera of claim 1, wherein the image is generated without interpolation in a red-green-blue (RGB) color space.

8. The digital camera of claim 1, wherein the processing component is configured to determine a first integration time for the first image sensor and a second integration time for the second image sensor for a frame.

9. The digital camera of claim 8, wherein the first integration time is different than the second integration time.

10. The digital camera of claim 8, wherein the processing component is configured to simultaneously determine the first integration time and the second integration time.

11. The digital camera of claim 1, wherein the image is associated with a first frame, and wherein the processing component is configured to determine a first integration time for the first image sensor and a second integration time for the second image sensor for a second frame, wherein the first integration time and the second integration time are based at least in part on an image signal level of the image.

12. The digital camera of claim 1, wherein the first optics component has a first field of view, and wherein the second optics component has a second field of view that is different than the first field of view.

13. The digital camera of claim 1, wherein the first optics component has a first focal length, and wherein the second optics component has a second focal length that is different than the first focal length.

14. The digital camera of claim 1, wherein the processing component is configured to simultaneously control data acquisition by the first channel and the second channel.

15. A method comprising:
   generating, by a first channel of a digital camera that includes a first optics component and a first image sensor, luminance data;

generating, by a second channel of the digital camera that includes a second optics component and a second image sensor, chroma data, wherein the chroma data is generated through combination of color band data with the luminance data; and generating, by a processing component of the digital camera, an image by combining outputs of the first channel and the second channel.

16. The method of claim 15, further comprising imaging, by the second channel, a color band to obtain the color band data.

17. The method of claim 15, further comprising determining a first integration time for the first image sensor and a second integration time for the second image sensor, wherein the first integration time is different than the second integration time.

18. The method of claim 17, wherein the first integration time and the second integration time are simultaneously determined by the processing component.

19. A tangible computer-readable medium having instructions stored thereon, the instructions comprising:

instructions to generate luminance data with a first channel of a digital camera, wherein the first channel includes a first optics component and a first image sensor;

instructions to generate chroma data with a second channel of the digital camera, wherein the second channel includes a second optics component and a second image sensor, wherein the chroma data is generated through combination of color band data with the luminance data; and instructions to generate an image by combining outputs of the first channel and the second channel.

20. The tangible computer-readable medium of claim 19, further comprising instructions to determine a first integration time for the first image sensor and a second integration time for the second image sensor, wherein the first integration time is different than the second integration time.

* * * * *